(12) United States Patent
Buerger, Jr. et al.

(10) Patent No.: US 7,335,580 B1
(45) Date of Patent: Feb. 26, 2008

(54) LAMELLAR-DERIVED MICROELECTRONIC COMPONENT ARRAY AND METHOD OF FABRICATION

(76) Inventors: Walter Richard Buerger, Jr., 20769 Mesarica Rd., Covina, CA (US) 91724; Jakob Hans Hohl, 10249 E. Placita Cresta Feliz, Tuscon, AZ (US) 85749; Mary Lundgren Long, 14416 S. Canyon Dr., Phoenix, AZ (US) 85048; Kent Ridgeway, 8617 W. Cavalier Dr., Glendale, AZ (US) 85305

( * ) Notice: Subject to any disclaimer, the term of this patent is extended or adjusted under 35 U.S.C. 154(b) by 0 days.

(21) Appl. No.: 11/515,284

(22) Filed: Sep. 1, 2006

Related U.S. Application Data

(63) Continuation-in-part of application No. 10/424,022, filed on Apr. 25, 2003, now Pat. No. 7,118,988, which is a continuation-in-part of application No. 10/223,446, filed on Aug. 19, 2002, now abandoned, which is a continuation-in-part of application No. 10/035,871, filed on Dec. 26, 2001, now abandoned, which is a continuation-in-part of application No. 09/821,957, filed on Mar. 30, 2001, now abandoned, which is a continuation-in-part of application No. 09/223,493, filed on Dec. 30, 1998, now abandoned, which is a continuation-in-part of application No. 08/639,887, filed on Apr. 26, 1996, now abandoned, which is a continuation-in-part of application No. 08/453,834, filed on May 30, 1995, now abandoned, which is a continuation-in-part of application No. 08/290,489, filed on Aug. 15, 1994, now abandoned.

(51) Int. Cl.
*H01L 21/20* (2006.01)

(52) U.S. Cl. ............... 438/584; 257/773; 257/E23.01; 257/E21.575

(58) Field of Classification Search ............... 438/400, 438/437, 758; 257/773, E21.575, E23.01
See application file for complete search history.

(56) References Cited

U.S. PATENT DOCUMENTS

| | | |
|---|---|---|
| 4,256,514 A | 3/1981 | Pogge |
| 4,593,351 A | 6/1986 | Hong et al. |
| 4,650,544 A | 3/1987 | Erb et al. |
| 4,803,181 A | 2/1989 | Buchman et al. |

(Continued)

OTHER PUBLICATIONS (no author), Bipolar Isolation Trench Fill by Deposition and Reflow of Poly-P-Xylylene; IBM Technical Disclosure Bulletin, Jun. 1986, pp. 249-250, v29, No. 1; the above publication was published by IBM Corp., headquarters at Armonk, NY, USA, and last published at their offices at IBM Corp., 500 Columbus Ave., Thornwood, NY, USA 10594.

(Continued)

*Primary Examiner*—Bradley K Smith

(57) ABSTRACT

Sub-lithographic lamella and pillar structures defined by larger lines or lamellae are described. A static random access memory (SRAM) cell structure is created in a three-dimensional format as a vertical stack of wired transistors. These transistors are fabricated from crystalline silicon, and supplemental wiring structure features are fabricated to comprise a circuit along the walls of a vertical pillar. The three-dimensional cell integrated circuit can be created by a single mask step. Various structural features and methods of fabrication are described in detail. Peripheral interface, a two pillar version and other supplemental techniques and structural variations are also described.

36 Claims, 13 Drawing Sheets

U.S. PATENT DOCUMENTS

| | | |
|---|---|---|
| 4,824,793 A | 4/1989 | Richardson et al. |
| 4,906,590 A | 3/1990 | Kanetaki et al. |
| 5,006,909 A | 4/1991 | Kosa |
| 5,013,680 A | 5/1991 | Lowrey et al. |
| 5,072,269 A | 12/1991 | Hieda |
| 5,096,849 A | 3/1992 | Beilstein, Jr. et al. |
| 5,100,823 A | 3/1992 | Yamada |
| 5,138,437 A | 8/1992 | Kumamoto et al. |
| 5,162,889 A * | 11/1992 | Itomi .......................... 257/69 |
| 5,275,968 A | 1/1994 | Takahashi et al. |
| 5,328,810 A | 7/1994 | Lowrey et al. |
| 5,398,200 A * | 3/1995 | Mazure et al. .............. 365/174 |
| 5,422,294 A | 6/1995 | Noble, Jr. |
| 5,471,087 A | 11/1995 | Buerger, Jr. |
| 5,726,084 A | 3/1998 | Boyd et al. |
| 5,818,069 A | 10/1998 | Kadosh et al. |
| 6,855,620 B2 * | 2/2005 | Koike et al. ................. 438/481 |

OTHER PUBLICATIONS (no author) The MP2000 PLUS+ Non-contact Surface Profiler; (sales brochure—no date—circa 1993); the above publication was published by Chapman Instruments, 50 Saginaw Dr., Rochester, NY, USA 14623, (all pages).

(no author) Parylene Conformal Coatings Specifications and Properties; (sales brochure—no date—circa 1992); the above publication was published by Specialty Coating Systems, 5707 W. Minnesota St., Indianapolis, IN, USA 46241, (all pages).

* cited by examiner

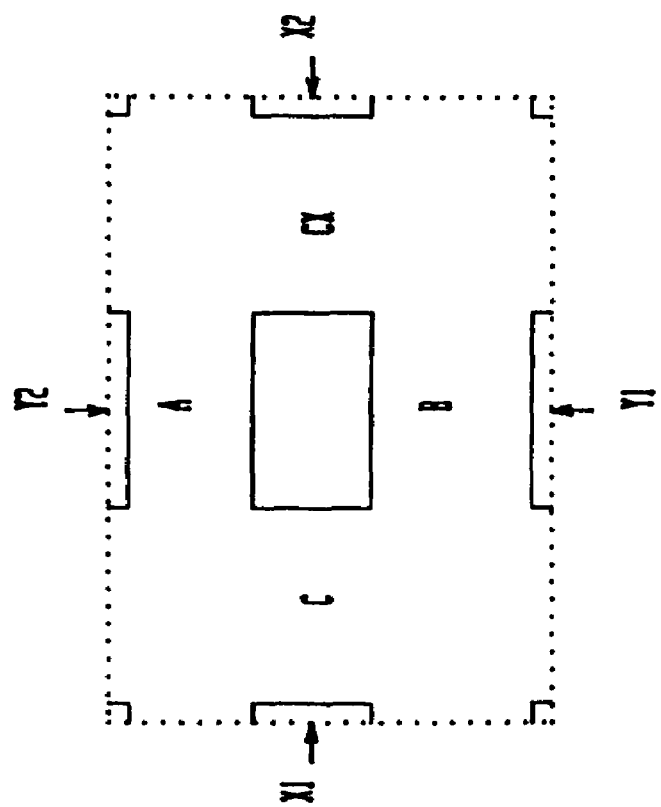

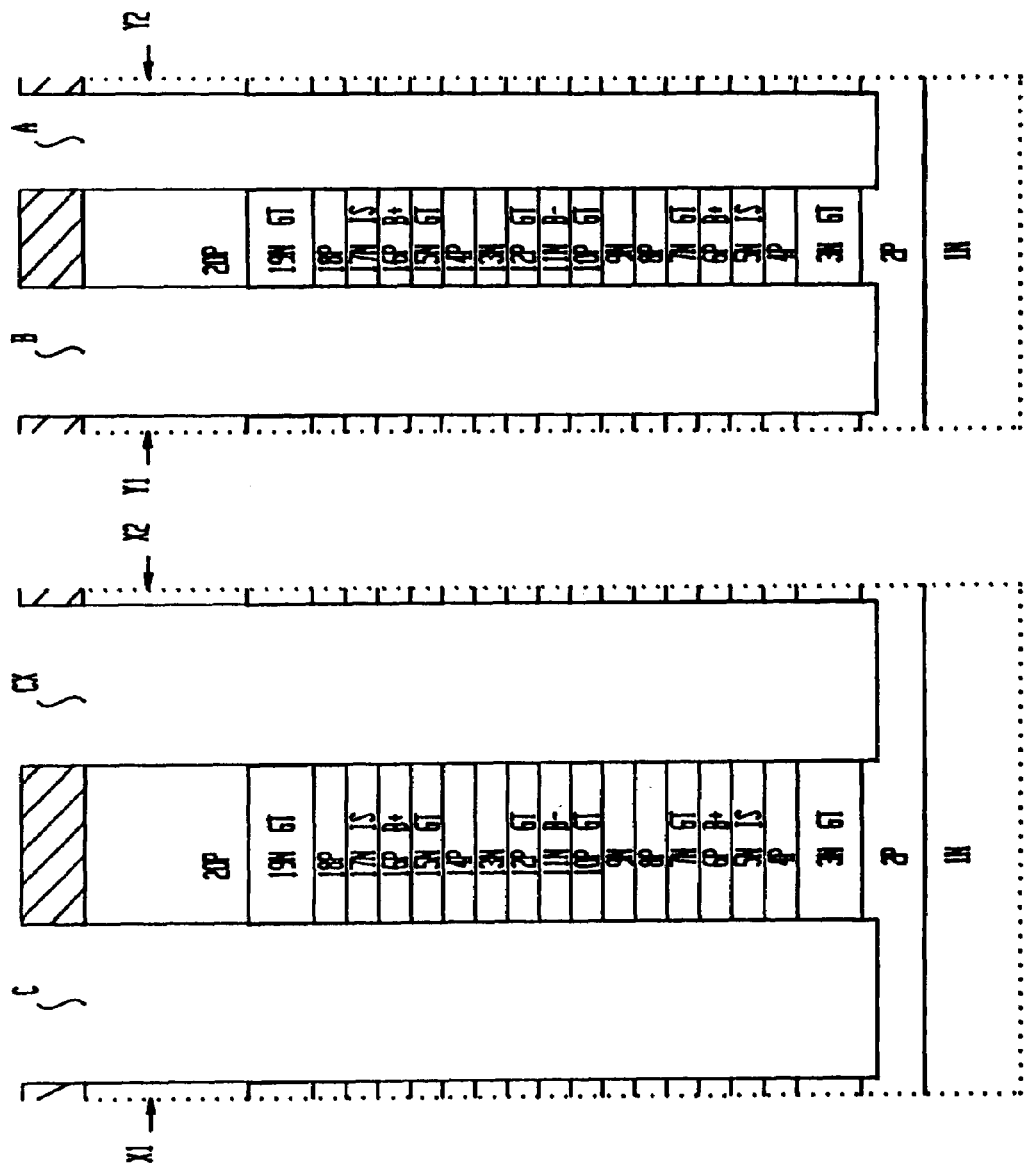

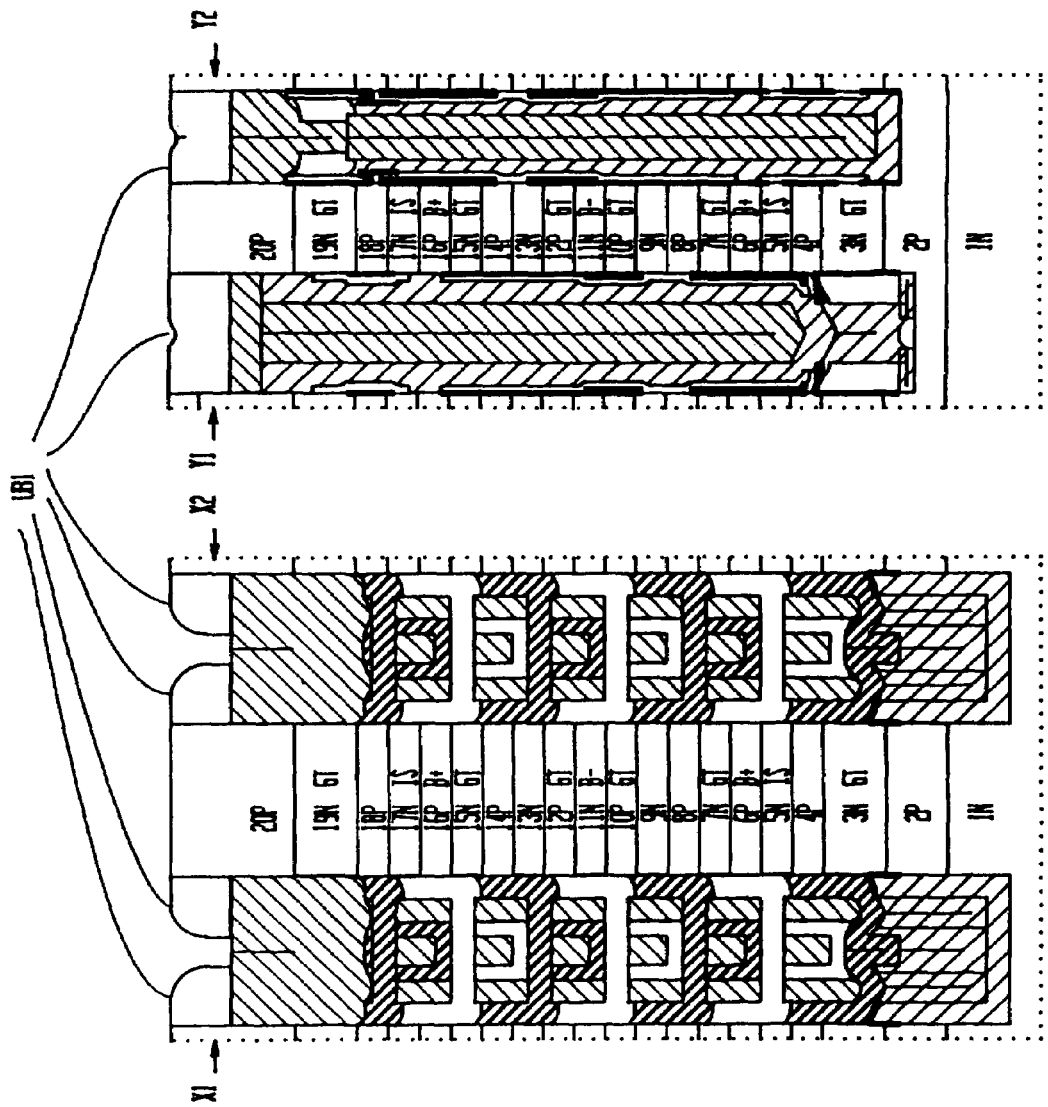

LAMELLAR-DERIVED MICROELECTRONIC COMPONENT ARRAY AND METHOD OF FABRICATION

This application is a continuation-in-part of application Ser. No. 10/424,022, filed Apr. 25, 2003, now U.S. Pat. No. 7,118,988, which is a continuation-in-part of application Ser. No. 10/223,446, filed Aug. 19, 2002, now abandoned, which is a continuation-in-part of application Ser. No. 10/035,871, filed Dec. 26, 2001, now abandoned, which is a continuation-in-part of application Ser. No. 09/821,957, filed Mar. 30, 2001, now abandoned, which is a continuation-in-part of application Ser. No. 09/223,493, filed Dec. 30, 1998, now abandoned, which is a continuation-in-part of application Ser. No. 08/639,887 filed Apr. 26, 1996, now abandoned, which is a continuation-in-part of application Ser. No. 08/453,834, filed May 30, 1995, now abandoned, which is a continuation-in-part of original application Ser. No. 08/290,489, filed Aug. 15, 1994, now abandoned.

FIELD OF INVENTION

The invention relates to structures and methods of fabrication for static random access memory (SRAM) integrated circuits, as well as for other integrated circuit applications, particularly those incorporating iterative arrays of like structures, such as other types of semiconductor memory, programmable logic, application specific integrated circuit (ASIC) underlays, and analogous applications including hard disks.

BACKGROUND OF THE INVENTION

The integrated circuit and hard disk industries have been downscaling their products essentially since their inception. The technology described herein enhances this ability by manufacturing circuits well below the limits of photolithography, using special structures and fabrication methods.

Various three-dimensional integrated circuits structures have been disclosed for DRAM cell structures. An integrated circuit structure incorporating multiple vertical components was disclosed in a co-pending U.S. patent application Ser. No. 07/769,850 (with subsequent continuations-in-part).

These earlier vertical integrated circuit structures do not conveniently lend themselves to incorporation of crystalline silicon regions in the various components of a multiple semiconductor component stack, particularly where a large number of such semiconductor components are present. Fabrication of these earlier integrated circuit structures typically require a large number of photolithographic steps.

SUMMARY OF THE INVENTION

This invention addresses the ability to fabricate such vertical stacks of components, as well as the ability to maintain crystalline regions where desired in the various components. These structures can be fabricated with as little as a single mask step.

As an object of the invention, a complex three-dimensional integrated circuit can be constructed of groups of components which include multiple transistors whose alternately doped regions are made from continuous crystal, these multiple transistors being arranged in a first axis, this first axis extending into a first dimension, where these components are interconnected by conductive circuitry extending in a plurality of axes, said plurality of axes extending into second and third dimensions.

As an object of the invention, a three-dimensional integrated circuit can be created by as little as one mask step.

[As an object of the invention, features may be fabricated at various locations on one or two vertical pillars which form elements of components of a larger integrated circuit.

It is an object of the invention to provide new capabilities for interconnecting and accessing circuitry formed below the photolithographic limit to conventional circuitry formed at or above the photolithographic limit, as well as the creation of unusually small electronic structures which can be used in various applications.

BRIEF DESCRIPTION OF THE DRAWINGS

FIGS. 3, 4 and 5 depict three mutually orthogonal cross-sections, with vertical trenches of three different widths below the windows in the masking layer, reaching down into the second-lowest semiconductor layer and leaving rectangular semiconductor pillars in between.

FIGS. 6, 7 and 8 depict three mutually orthogonal cross-sections of a preceding structure, which is the implementation of the structure of FIG. 2, more completely and detailed.

DESCRIPTION OF THE PREFERRED EMBODIMENT

Figure 1:
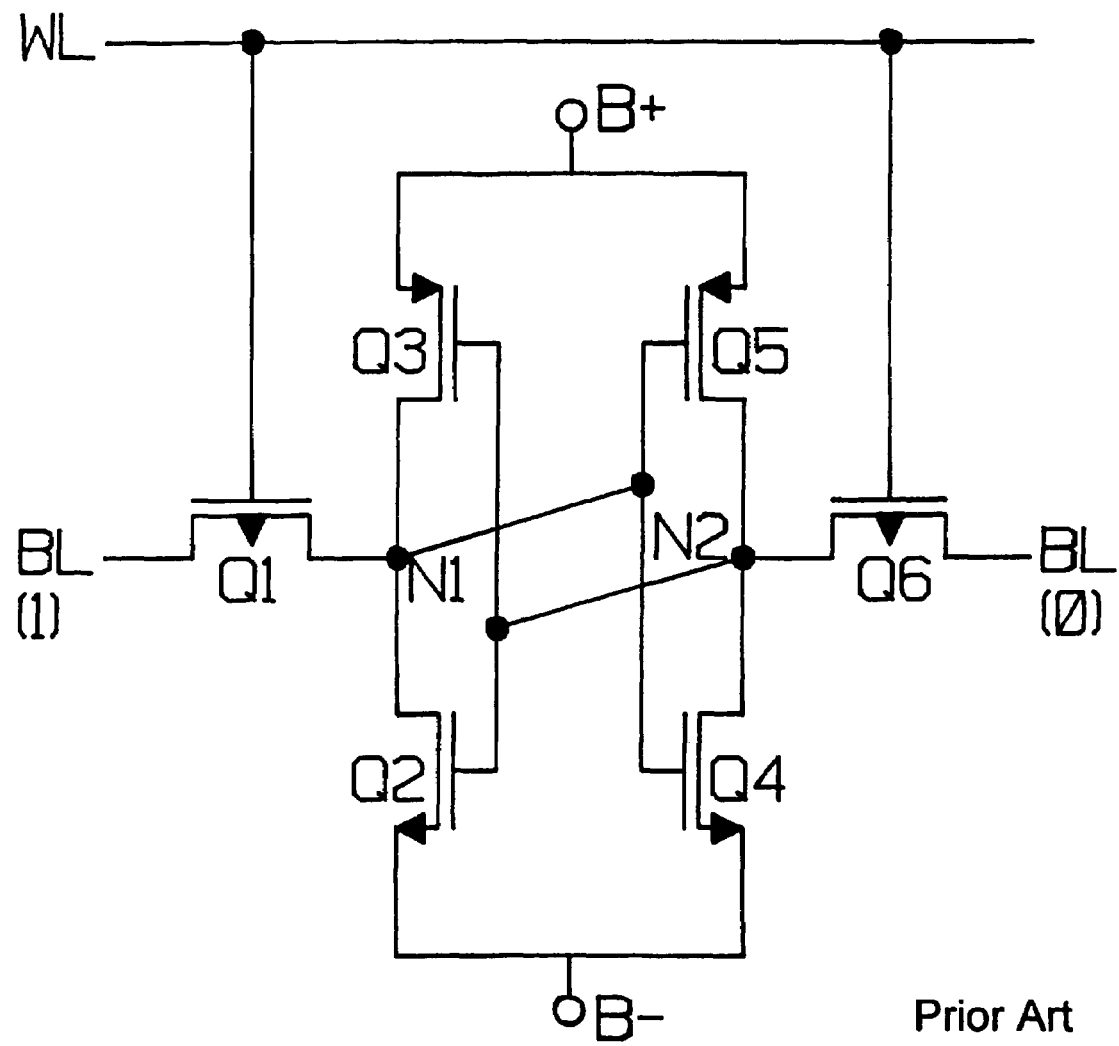
FIG. 1 is a conventional schematic of the subsequently described SRAM cell.

The description of the invention described in this specification document incorporates information from a U.S. patent application Ser. No. 10/424,022 by applicants "Buerger, Walter Richard JR.; et al.," (specifically: "Buerger, Walter Richard JR.; (Covina, Calif.); Hohl, Jakob Hans; (Tuscon, Ariz.); Long, Mary Lundgren; (Phoenix, Ariz.); Ridgeway, Kent; (Glendale, Ariz.)"), USPTO publication number 20050079721, published by the USPTO on Apr. 14, 2005, which is herein incorporated by reference. This incorporation by reference particularly includes the text discussed in the subsequently identified text portions of the aforementioned Application (publication number 20050079721).

In the following identified text portions, paragraph numbers enclosed in brackets in the published application document (20050079721) are identified in the formats "<Par. ####>" or "<through Par. ####>", where "####" represents the paragraph numbers used in the published version. "<Par. ####>" with "<through Par. ####>" identifies additional text which is also incorporated by reference. Brackets used elsewhere in the published text to identify cross-referencing codes, etc., have been replaced in the following identifying text portions with these identifiers. Figure numbers (below) for the accompanying drawings reference the figures listed in the foregoing Brief Description of the Drawings, not the numbers in the incorporation by reference text. The text below is either excerpted from or comparable to the text in the incorporation by reference publication for the paragraphs cited.

Identified text portions incorporated by reference are as follows:

The invention relates to structures and methods of fabrication for static random access memory (SRAM) integrated circuits, as well as for other integrated circuit applications, particularly those incorporating iterative arrays of like structures, such as other types of semiconductor memory, programmable logic, application specific integrated circuit (ASIC) underlays, and analogous applications.

Various three-dimensional integrated circuits structures have been disclosed for DRAM cell structures. An integrated circuit structure incorporating multiple vertical components was disclosed in a co-pending U.S. patent application Ser. No. 07/769,850 (with subsequent continuations-in-part).

These earlier vertical integrated circuit structures do not conveniently lend themselves to incorporation of crystalline silicon regions in the various components of a multiple semiconductor component stack, particularly where a large number of such semiconductor components are present. Fabrication of these earlier integrated circuit structures typically require a large number of photolithographic steps.

This invention addresses the ability to fabricate such vertical stacks of components, as well as the ability to maintain crystalline regions where desired in the various components. These structures can be fabricated with as little as a single mask step.

As an object of the invention, a complex three-dimensional integrated circuit can be constructed of groups of components which include multiple transistors whose alternately doped regions are made from continuous crystal, these multiple transistors being arranged in a first axis, this first axis extending into a first dimension, where these components are interconnected by conductive circuitry extending in a plurality of axes, said plurality of axes extending into second and third dimensions.

As an object of the invention, a three-dimensional integrated circuit can be created by as little as one mask step.

As an object of the invention, features may be fabricated at various locations on one or two vertical pillars which form elements of components of a larger integrated circuit.

It is an object of the invention to provide new capabilities for interconnecting and accessing circuitry formed below the photolithographic limit to conventional circuitry formed at or above the photolithographic limit. <Par. 0010> <through Par. 0445>

The following Description of the Preferred Embodiment is organized into six parts: I. Considerations Regarding The Following Description, II. Fabrication Technology Used In The Following Step Sequence, m. SRAM Cell Fabrication Step Sequence, IV. Pillar Masking Techniques, V. Periphery, and VI. Supplemental Techniques & Clarifications. Part I introduces concepts, conditions and clarifications regarding the Part III step sequence. Part II explains fabrication methods used in the Part III step sequence. Part III is the fabrication step sequence itself Thus, Parts I and II provide background information regarding the step sequence(s) in Part III, and may be used for reference while reading in detail the step sequence(s) of Part III. Part IV describes techniques for creating masks which can be used to create pillars. Part V describes techniques for creating peripheral circuitry. Part VI describes various supplemental techniques and clarifications for the previously described technology.

The step sequence of Part III demonstrates that features may be fabricated at various locations on a vertical pillar which form elements of components of a larger integrated circuit. These capabilities create a basis for a three-dimensional circuit integration technology.

Figure 2:
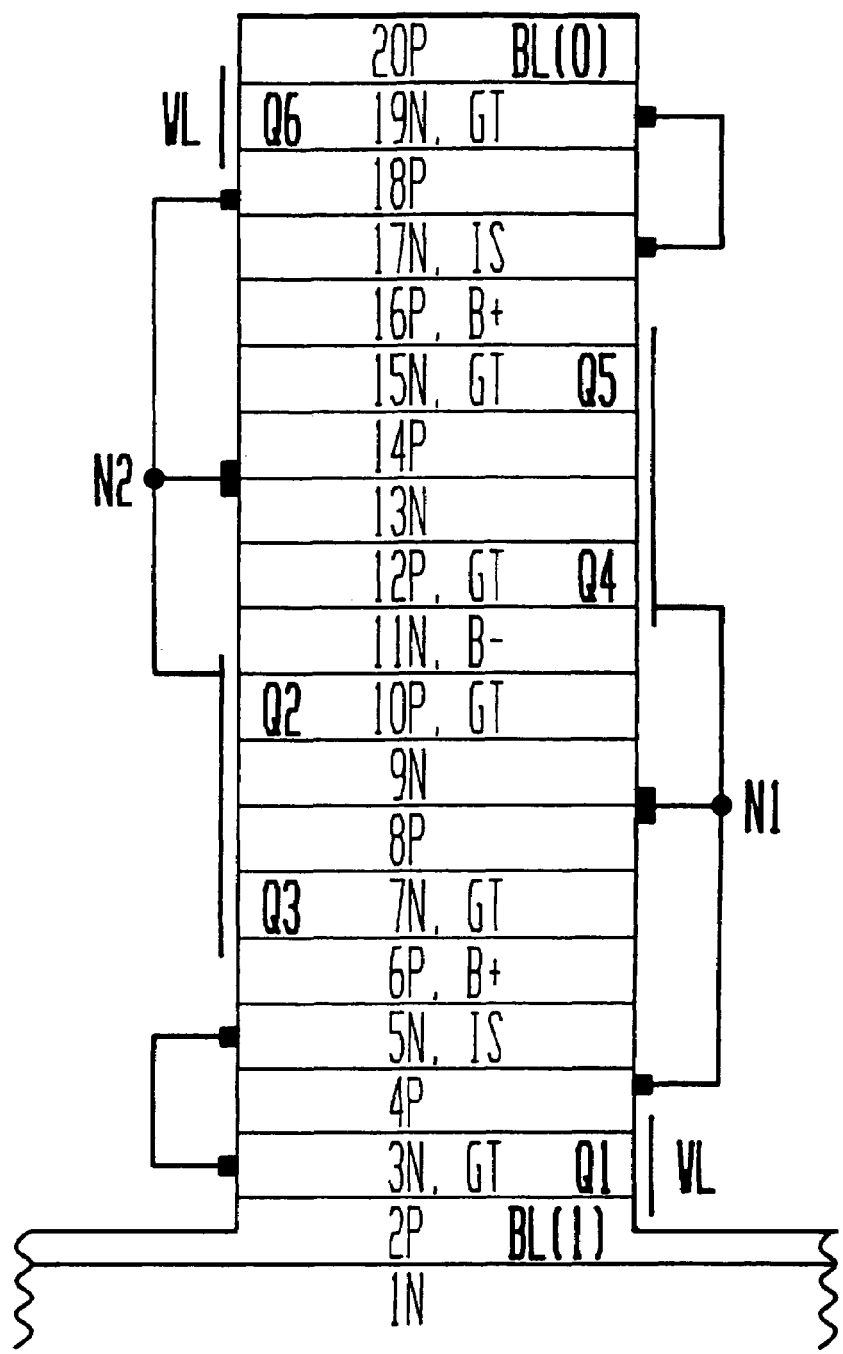
FIG. 2 depicts the schematic of FIG. 1 in the format of the subsequently described SRAM cell.

The step sequence of Part III describes 266 process steps (or step groups) to be performed on a silicon semiconductor wafer which result in the creation of one or more CMOS type static random access memory (SRAM) cells. This step sequence amounts to a process algorithm, where the step sequence of the algorithm determines the form of the semiconductor structures and wiring interconnects of a microelectronic integrated circuit. These process steps primarily involve the controlled deposition and etching of selected materials. Groups of these steps are used to fabricate specific structures which, taken together, comprise the complete SRAM cell. The conventional-style schematic of this cell is depicted in FIG. 1. FIG. 2 shows the schematic of FIG. 1 redrawn in the wiring and semiconductor spatial relationship of the structure of FIGS. 6, 7 and 8.

Summary of the Part and Sub-Part Headings Used in the Subsequent Description: <Par. 0450> <Through Par. 0495>

In Parts II, II and IV, three types of paragraphs are typically present as follows: Paragraphs preceded by a code enclosed in brackets . . . explain the capabilities and value of the step(s) which follow . . . Paragraphs beginning with "FIG." or "FIGS." are process steps (which may include more than one process). These process steps are coded with parenthetic codes such as "(I)," "(LB1)," etc. These parenthetic codes are the primary step descriptors, and the FIG. numbers are expected to correspond as described in the text. Paragraphs beginning with neither brackets or "FIG(S)." are otherwise descriptive or explanatory text. Parts V and VI use similar formats, codes and descriptors where applicable.

I. Considerations Regarding the Following Description Application:

The following integrated circuit technology is intended for and described as a method of making static random access memory (SRAM) cell arrays, although it may be extended to a variety of other IC fabrication applications and structures. The following description is intended to be instructive regarding how to fabricate a wide variety of individual structural features using described steps or described short or long sequences of steps. It will be apparent to those skilled in the art that the techniques described independently and as steps, step sequences and combinations thereof are independently applicable to a wide variety of integrated circuit structures and applications. The SRAM cell example presented is intended to provide an illustrative application for the subsequently described inventions.

Circuitry a conventional schematic of the subsequently described SRAM cell.

the preceding conventional schematic in the format of the subsequently described pillar SRAM cell.

SRAM cell structure operation: Substrate layer 1N is positively biased with respect to layer 2P in a conventional manner, so as to diode isolate the lower bit lines in the structure subsequently described in Part III.

Structures: <Par. 0504> <through Par. 0511> Describe items to be considered regarding the subsequently described structures, and regarding comprehending the text and drawings.

Processes: <Par. 0513> <through Par. 0529> Describe items to be considered when fabricating the subsequently described structures, and regarding comprehending the text and drawings.

Materials: <Par. 0531> Describes items to be considered regarding materials which can be used Drawings: <Par. 0533> <through Par. 0536> Describe items to be considered regarding comprehending the drawings.

Terminology: <Par. 0538> <through Par. 0541> Describe and clarify terminology used in the text.

II. Fabrication Technology Used in the Following Step Sequence:

Vertical Masking techniques are described in <Par. 0543>"sleeve" and "piston," masking, and in more detail in:

Lower Trench Masking Plug fabrication considerations <Par. 0546> <through Par. 0550>;

Materials and techniques may be used as described in <Par. 0552> <through Par. 0560>, Upper Trench Wall Masking Coating fabrication: <Par. 0562> <through Par. 0563>, Subsequent Vertical Masking Steps: <Par. 0565> <through Par. 0567>.

Additional Vertical Masking Options and considerations are described in <Par. 0569> <through Par. 0576>.

III. SRAM Cell Fabrication Step Sequence

Initial Steps:

Discuss the initial creation of multiple epitaxial layers

Fabrication of Lower Bit Lines is described in <Par. 0582>-<Par. 0639>, noting that:

{LB-13} A semiconductor wafer may be trench etched to create pillars which will contain the various doped continuous crystal regions and junctions which are used to form multiple stacked transistors. <Par. 0582>

{LB-2} A second accurately etched material such as reflowed Parylene (other than the trench wall or bottom material) may be used to set a more precise vertical level than that of the trench bottoms, in an inaccurately or nonuniformly etched group of trenches.

{LB-6} A pillar side wall protector may be formed in a single trench axis, by deposition of an alternate selectable material which closes together in the first axis, followed by etching back a remaining gap in the second axis.

{LB-7} Parylene may be used as a pillar side wall protector by filling trenches with it in a single trench axis. <Par. 0587> <through Par. 0588>

{LB-8} One trench axis may be etched deeper than another without use of photolithography. <Par. 0590> <through Par. 0585>

{LB-8A} One or more sides of a pillar may be thermally oxidized to serve as gate insulation layers which extend in a vertical plane.

{LB-8B} A protective coating may be deposited over a vertical gate insulation coating, so as to allow further processing of a pillar circuit without damage to the vertical gate insulation coating in subsequent steps.

{LB-8C} The tops and bottoms of an omni-directional deposition of a gate layer material can be etched away only in the vertical axis, so as to leave material for gate insulation of multiple pillar transistors extending only over the vertical surfaces of the pillars. <Par. 0599> <through Par. 0612>

{LB-9} A trench may be partially filled with an insulator so as to make an insulative plug, so as to provide insulation between lower conductive regions of adjacent pillars.

{LB-10} An insulative plug may be fabricated by creation of vertically extending fingers made of the plug material, followed by joining these fingers together by deposition of a fill between them, followed by etching away of the thin layer of upper exposed plug material, resulting in a continuous plug which has the height of the vertically extending fingers. <Par. 0615> <through Par. 0622>

{LB-11} Two narrower regions at the bottom of a trench can be closed out, followed by omni-directional wet etch or dry etch-back of the top, so as to create a low plug-like feature in the bottom of a trench. <Par. 0624> <through Par. 0626>

{LB-12} Thus, groups of conductive bit lines on horizontal planes can be constructed below the upper surface of a semiconductor wafer (significantly below the height of the pillar tops) to control a semiconductor memory (as will be subsequently described), without the use of photolithography.

Discuss the creation of a Center Partition, in this case in conjunction with fabrication of lower bit lines, noting that:

{LB-13} A center partition can be created in the middle of a trench without use of photolithography.

{LB-14} A center partition can be created by coating the sides of a trench with a highly selectable material, filling the interstice with partition material, then removing the aforementioned highly selectable material on the sides of the partition.

{LB-15} Parylene is a preferred highly selectable material for the sides of such a partition. <0632> <through 0633>

{LB-15A} A mechanically supportive base can be created for a vertically extending structure made from subsequently deposited materials.

{LB-15B} A mechanically supportive base can be created for a center partition.

Describe the creation of Lower Word Lines, noting that:

{LW-1} A center partition may be used to cause a wide trench to close out before narrower trenches.

{LW-2} Trenches which are narrower and wider may be caused to close out while leaving trenches of an intermediate size open. <Par. 0643>

{LW-3} A material coating the sides of a center partition in a vertical trench may be etched back at intermittent locations in the horizontal axis without use of photolithography, so as to expose intermittent portions of the sides of the center partition. <Par. 0645>

{LW-4} Center partitions crossing an otherwise continuous trench may be etched away, so as to make the trench continuous. <Par. 0647>

{LW-5} Alternating trenches may be etched so as to make them deeper than intervening alternating (adjacent) trenches without use of photolithography. <Par. 0649> <through Par. 0655>

{LW-6} Oblique angle directional deposition can be used to coat regions at tops of trenches, while not coating down into trenches.

{LW-6A} Such oblique angle directional deposition can be achieved by collimated sputtering from a sputtering source with collimator.

{LW-6B} Such oblique angle directional deposition can be from an evaporative source.

{LW-7} A protective coating may coat the top of a trench but not the bottom of a trench, so as to mask the top portion but not the bottom portion. <Par. 0660> <through Par. 0662>

{LW-8} A selected material may be removed from the bottom of a trench while not removing it from the top of the trench.

{LW-9} Material coating the sides of a trench may be removed only at the bottom of the trench, so as to make a narrow undercut which has a width which is approximately equal to the thickness of the coating. <Par. 0665> <through Par. 0666>

{LW-10} An undercut may be filled with an omni-directional deposition so as to close it out.

{LW-11} A feature may be created at the bottom of a trench; by close-out of a deposition below an overhanging material, followed by etch-back of the exposed portion of the deposition, followed by removal of the overhanging material.

{LW-12} An insulated region may be created at the bottom of a trench by close-out of a deposition below an overhanging material, followed by etch-back of the exposed portion of the deposition, followed by removal of the overhanging material.

{LW-13} An insulation region dividing two vertically extending conductive regions (to be subsequently described) in a trench may be created by the aforementioned method. <Par. 0671> <through Par. 0674>

{LW-14} SIMOX implantation of the bottoms of a pillar-trench array can provide an insulative layer at the bottoms of the trenches of this array. <Par. 0676>

{LW-15} A conductor may be deposited along vertical trench walls above horizontal insulative extensions in a trench, the deposited conductor being horizontally narrower than the insulative horizontal extensions below it, this deposition of conductor being followed by etching away of the tops and bottoms of the conductor, thereby allowing the deposited conductor to be insulated from lower regions in the trench by the insulative horizontal extensions below the deposited conductor. <Par. 0678> <through Par. 0681>

{LW-17} Continuous horizontal conductive lines (circuit traces) in a trench may be created by etch-back of the upper portion of the aforementioned conductor by omni-directional wet etch or dry etch of the sides of the conductor above a lower trench masking plug.

{LW-18} Control lines for FET gates may be created by the above method.

{LW-19} Word lines for a memory may be created in a trench by the above method. <Par. 0685> <through Par. 0686>

{LW-20} As a result of the foregoing steps, groups of conductive word lines on horizontal planes can be constructed below the upper surface of a semiconductor wafer to control a semiconductor memory, without the use of photolithography.

{B-23} A coating may be omni-directionally deposited in a trench above and below a step which narrows the trench, so that the lower area will close out before the upper area, thereby allowing more rapid more precisely controlled etch-back of the upper area.

{LW-21} An insulator may be created between two adjacent horizontal conductors in a trench by close-out of an insulative deposition between the conductors, followed by omni-directional wet etch or dry etch-back of insulative material coating higher portions of the trench. <Par. 0690> <through Par. 0696>

{LW-22} Trenches of two narrower sizes may be closed out with a deposited material so as to leave trenches of a third wider size open.

{LW-23} Parylene is preferred for the aforementioned deposited close-out material. <Par. 0699> <through Par. 0700>

{LW-24} When a first selectable material coating the walls of a trench is itself coated with a second material, the tops and bottoms of the first and second trench coating materials may be etched away, followed by coating the second coating material with a third coating material which will select with the first coating material (and which may be the same material as the first coating material), so that the tops of the first and third coating materials can be etched down from the top during the same etching step.

{LW-25} The aforementioned method may be used as a means to fabricate walls and a center partition of materials of the same selectivity in a trench.

{LW-26} Walls coated on trenches extending in a first axis may be used so as to enclose regions between pillars in an axis orthogonal to the first axis. <Par. 0704> <through Par. 0710>

{LW-27} Trenches may be capped in a first axis, while leaving trenches (or trench holes) uncapped in an orthogonal axis.

{LW-28} Trenches may be capped in a first axis, while uncapping alternating trenches (or trench holes) in an orthogonal axis.

{LW-29} Narrower and wider trenches can be caused to remain capped when an intermediate width trench is uncapped. <Par. 0714> <through Par. 0719>

B Trench:

{B-1} A protector may be used for gate oxide in a vertical trench to protect the gate from further trench processing while wiring circuits in the trench. <Par. 0722>

{B-2} An upper trench wall masking coating can be used to mask a first material for etching, where this first material in turn masks a second material for etching.

{B-2A} A lower trench masking plug and upper trench wall masking coating can also be used to mask a first material for etching, where this first material in turn masks a second material for etching (not shown, but as follows except with the lower trench masking plug not etched down so far as to be eliminated). <Par. 0725> <through Par. 0729>

{B-3} When a first material extends vertically up and down the walls of a trench, where this first material is coated with a second material where the thickness of this second material overhangs lower portions of the trench, and where the first material also extends out horizontally beneath the bottom of the second material so as to form an "L," when this first material is exposed at the top of the trench, this exposed upper portion of this first material may be coated over by a directional deposition of a third material which is selectable against the first material (which third material may be the same as the second material), so as to make the lower portion of the first material which is exposed below the overhang material accessible to back- or undercut-etching, while the top portion of the first material remains protected from the etchant.

{B-4} Parylene is preferred as such a first material. <Par. 0732> <through Par. 0736>

{B-5} A short horizontal insulative tab may be created which contacts a pillar side wall at the bottom of a trench by deposition of insulative material which closes out between an overhanging material above it and the bottom of the trench, where this deposition is followed by removal of the extraneous insulative material and overhanging material. <Par. 0738> <through Par. 0741>

{B-5A} A short horizontal conductive tab may be created which contacts a pillar side wall at the bottom of a trench by deposition of conductive material which closes out between an overhanging material above it and the bottom of the trench, where this deposition is followed by removal of the extraneous conductive material and overhanging material. <Par. 0743> <through Par. 0755>

{B-7} A first material coating the walls of a trench can have the upper and lower horizontal surfaces removed so that the remaining first material extends vertically up and down the walls of the trench and overhangs the lower portion of the trench, thus exposing a conductor which wrapped down the sides of the trench and around beneath the first material. <Par. 0757>

{B-8} Such a conductor can be etched back to the thickness of the overhang so that the thickness of the overhang serves to pattern a feature. <Par. 0759> <through Par. 0761>

{B-9} An upper portion of a conductor can be selectively separated from a lower outward extending conductor to allow circuit contact variations before later conductive relinkage between the two.

{B-10} A selectable lower trench masking plug may be set at a preferred height so as to protect unlinked lower exposed conductive regions to permit etching above these regions without damage to them. <Par. 0764>

{B-11} Wiring material may be used as a vertically extending mask to allow selective etching of insulator on a wired pillar. <Par. 0766> <through Par. 0767>

{B-12} Insulator can be caused to vary in thickness along the sides of a wired pillar, so that the conductive wiring will act as a gate for certain FETs, but not activate gates for other FETs adjacent to said conductive wiring. <Par. 0769> <through Par. 0773>

{B-14} A conductive coating can be deposited so that conductive traces are stood off from a pillar by various insulator thicknesses, where various separate conductive traces then become linked together into a more complete electronic circuit trace.

{{B-6} Chemical vapor deposition of tungsten is preferred as a conductive coating for the various subsequent as well as aforementioned processes due to its selectivity, refractory characteristics, and lack of circuit degradation features. <Par. 0776>

{B-15} Conductive wiring between adjacent pillars may be divided by coating the vertical sides of the pillars with a material which overhangs the lower portion of the adjacent trench, followed by vertically etching away the linking conductor between the two pillars so as to separate the wiring. <Par. 0778> <through Par. 0783>

{B-16} A conductive linkage may be separated by selective etching with a lower trench masking plug and upper trench wall masking coating, so as to make more than one conductive trace running up and down the pillar. <Par. 0785>

{B-17} A selectable lower trench masking plug can be used so as to permit etching away of any extension of a conductive trace leading to the top of a pillar, so as that everything below the height of the lower trench masking plug will remain usable conductive wiring. <Par. 0787>

{B-18A} Thus, electronic circuitry can be wired so as to connect electronic circuitry which includes a plurality of transistors, without the use of photolithography.

{B-18B} Thus, a side of a pillar of alternating doped regions of semiconductor material can be wired so as to connect electronic circuitry which includes a plurality of transistors, without the use of photolithography.

{B-19} Likewise, electronic circuitry which includes a plurality of transistors can be vertically wired beneath the surface of a semiconductor wafer, without the use of photolithography.

{B-20} Conductive traces on one or more sides of a column can be coated with an insulator which is etched back above the height of a lower trench masking plug formed from it, so as to protect the circuitry. <Par. 0792>

{B-21} Such an insulated section can be filled with a material which can tolerate voids within its closed-out regions, so as to reliably contain voids without degradation from trapped reactant gasses.

{B-22} Parylene is a preferred material for such closed-out regions. <Par. 0795> <through Par. 0797>

Caps:

{B-24} A cap above a preset level can be created in an open trench while other trenches remain capped.

{B-25} A cap of an open trench can be created by deposition and side closure (close-out), followed by etch-back of the deposition to the height of other caps.

{B-26} The height of the lower portion of a first cap can be set lower than the height of the lower portion of other caps, so that these other caps will be etched away first during top-etching of all caps. <Par. 0802> <through Par. 0803>

{B-27} The height of the bottom of a first cap can optionally be set higher than the height of the bottoms of other caps, so that the first cap will be etched away first during top-etching all caps (not shown).

{B-28} The height of the bottom of a first cap can optionally be set between the heights of the bottoms of other caps, so that the first cap will be etched away after top-etching etches away other caps with higher bottoms, but where the first cap is etched away before other caps with lower bottoms are etched away (not shown).

{B-29} The top of a cap can be etched down by ion milling.

{B-30} The tops of caps may be etched away by ion milling, so as to reduce all their heights, thereby reducing the subsequent heights of some caps, while eliminating other caps.

{B-31} The top of a cap can be etched down by wet etch or omni-directional dry etch (workable for the subsequent FIGS., but not shown).

{B-32} The tops of caps may be etched away with wet etch or omni-directional dry etch, so as to reduce all their heights, thereby reducing the subsequent heights of some caps while eliminating other caps (workable for the subsequent FIGS., but not shown). <Par. 0810>

{B-33} Uncapped trenches (in this case trench subdivisions on opposing sides of a partition) which are narrower than the other trenches may be recapped by deposition and etch-back of a capping material, so as to leave any uncapped wider trenches still exposed. <Par. 0813>

{B-34} A narrower trench can be closed and an intermediate sized trench can be opened by the aforementioned method when the widest trenches are already capped. In this case as subsequently demonstrated, "narrower" includes sub-trench widths on either side of a partition as in the C trench, rather than the original C trench width before partitioning, and "widest" refers to the B trench. <Par. 0815> <through Par. 0816>

A Trench:

{A-1} The bottom and sides of a conformal conductor coating may be etched away, so as to break connection between conductive traces on the sides of adjacent pillars where this connection crosses the bottom of an intervening trench. <Par. 0825> <through Par. 0828>

{A-2} A lower trench masking plug may be used to electrically isolate and chemically selectively protect a completed lower conductive link, while a new upper conductive link is subsequently fabricated. <Par. 0830> <through Par. 0831>

{A-4} A first selectable material may be used as a mask to create multiple features in a second intervening (sandwiched) layer of a second selectable material along the walls of a vertical trench, without use of photolithography. <Par. 0833> <through Par. 0839>

{A-5} A second conductive layer can be used to electrically connect direct contacts to a pillar surface with preexisting lower conductive layers along the sides of the vertical pillars, as an expeditious means of making wiring along the sides of the vertical pillars. <Par. 0841> <through Par. 0846>

{A-6} Along a wall of a vertical trench where a layer coated with an overhanging material wraps around below the overhanging material to make an "L," the space between the overhang and the material in the trench vertically below it may serve as a mask for a layer of material closer to the trench wall, if the horizontal extension of the "L" is etched back to expose this material closer to the trench wall. <Par. 0848> <through Par. 0850>

{A-7} This method may be used to isolate lower circuitry on a wired pillar from upper circuitry on the wired pillar. <Par. 0852> <through Par. 0863>

Caps: <Par. 0865> <through Par. 0866>

{T3-1} A walled trench may be opened for processing by removal of the primary fill material, followed by wet etch or omni-directional dry etch of the walls.

{T3-2} A walled trench with a center partition may be opened for processing by removal of the primary fill material, followed by wet etch or omni-directional dry etch of the walls and center partition. <Par. 0869> <through Par. 0871>

C Trench Side Etching: <Par. 0873> <through Par. 0874>

{CS-1} Where a pillar interstitial structure takes the form of a tube of approximately rectangular cross-section, and comprises a plurality of concentric layers of selectable filled-in materials, the outer layer of the tube which contacts the pillars may be partially etched away with an omni-directional etch, so as to leave narrowed sections of this outer layer material running vertically along the sides of each opposing pillar. <Par. 0876> <through Par. 0878>

{CS-2} Where a thin conductor is sandwiched between two adjacent vertical pillar-like structures (in this case where the aforementioned tube serves as one such pillar-like structure), this thin conductor can be horizontally etched back, so as to leave a narrowed vertically extending conductive trace between the middles of said vertical pillar-like structures. <Par. 0880>

{CS-3} A gap between closely spaced adjacent vertical pillar-like structures can be filled with insulator, so as to insulate and chemically protect a narrower vertically extending conductive trace between the middles of the adjacent vertical pillar-like structures. <Par. 0882>

{CS-4} A material coating closely spaced adjacent pillars from the sides of these adjacent pillars can be etched off, so as to leave material only in the thin space between these adjacent pillars. <Par. 0884>

{CS-5} The aforementioned method can be used to insulate and protect vertically extending circuit traces along the sides of pillars where the coated material is an insulator.

Caps:

{CS-6} Caps of a first material can be replaced with caps of a second material, so as to provide caps of a different selectivity.

{CS-7} Caps of a plurality of materials can be created, so as to allow different selectivities when etching against the cap materials.

C Trench:

{C-1} A vertical stack of a plurality of stacked materials can be created in a trench.

{C-2} Such a stack can be constructed by creation of a sequence of vertically stacked regions of finger-like structures.

{C-3} If such stacked structures are created in a trench hole, the stack can be fabricated with the same process sequence, but the fingers of the finger-like structures form concentric rather than elongated patterns.

{C-4} Isolated conductive links can be created by this method.

{C-5} Adjacent regions on a vertical pillar can be conductively connected by this method.

{C-6} Vertically connected regions on a vertical pillar can be insulated by this method.

{C-7} Vertically extending regions of the same height on adjacent columns can be electrically isolated by this method.

{C-8} Power distribution lines (busses) can be created by this method.

{C-9} Gridded power distribution lines can be created through use of the combination of the above conductive traces with conductive regions in intervening pillars.

{C-10} Power plane decoupling for spike reduction can be implemented by providing closely spaced power grids within an integrated circuit, so as to form a capacitor between the grids. <Par. 0910> <through Par. 0939>

{C-11} A multi-material cap can be removed to gain access to the structures below. <Par. 0941> <through Par. 0944>

{C-12} A trench or trench hole of intermediate width can be protectively capped with a selective material while leaving trenches of greater and lesser width open.

{C-13} Such a cap can be fabricated by creation of a center partition in a trench or trench hole which is of intermediate width compared to other wider and narrower trenches on a wafer, as a means of causing this intermediate trench's (or trench hole's) early closure with a subsequent deposition which closes out. <Par. 0947> <through 951>

Upper Word Lines:

{UW-1A} Where a first vertically extending selectable material is vertically sandwiched between walls of a second vertically extending selectable material, the first selectable material can be etched down so as to expose the walls of the second selectable material, followed by the multi-directional etching of the second selectable material to a preferred height, as indexed by the height of the first selectable material.

{UW-1B} It is possible to recess the conductive gate layer of a vertical gate on a vertical transistor so as to recess it from the edges of the underlying gate insulator.

{UW-1C} It is possible to form an access window to a conductor within an insulative coating on the sides of a vertical surface in an integrated circuit, where edges of this access window extend vertically and are displaced horizontally on the vertical surface. <Par. 0965> <through Par. 1007>

{UW-2} Conductive traces on the opposing sides of a trench can be insulated by omni-directional deposition of an insulator which fills the region between them so as to fold together (close out) first between these conductive traces, and then above them, followed by etching this insulator back to a preferred height so that a remaining upper portion of this insulator serves as an insulative cap.

{UW-3} Trenches of multiple widths can be filled by deposition of a selectable material which folds together in or above the trenches, followed by etching said selectable material back to a preferred height. <Par. 1010> <through Par. 1015>

{UW-4} Thus, groups of conductive word lines on horizontal planes can be constructed for a memory at multiple vertical levels without the use of photolithography.

Upper Bit Lines:

{UB-1} Groups of conductive bit lines on horizontal planes can be constructed for a memory at multiple vertical levels without the use of photolithography. <Par. 1019> <through Par. 1020>

Figure 6:
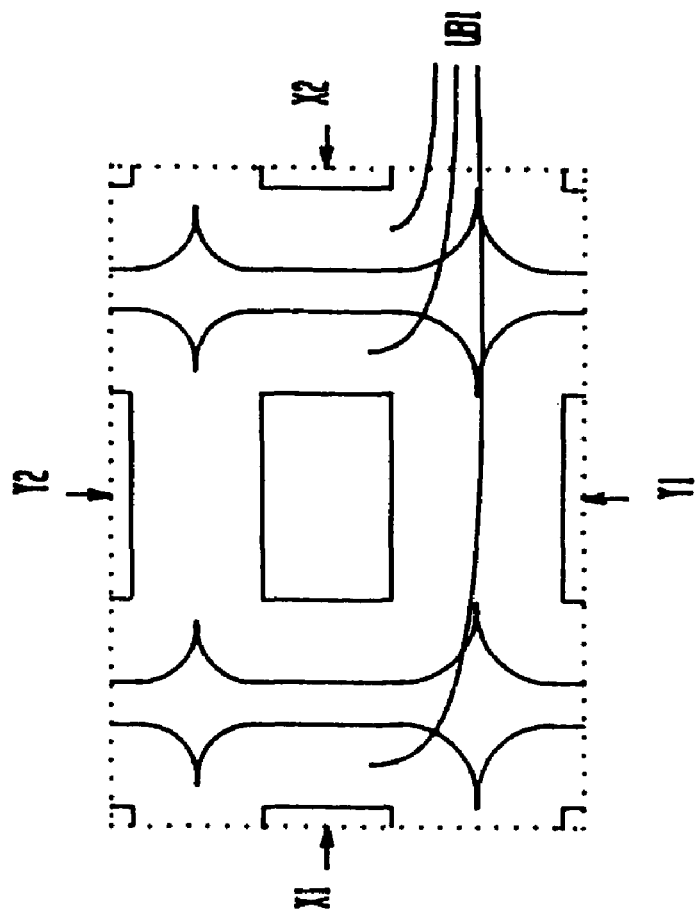
Figure 9:
FIG. 9 depicts the cross-section of one of a set of repeating trenches in a first material.
Figure 10:
FIG. 10 depicts the same cross-section, with a layer of a second material covering all surfaces.
Figure 11:
FIG. 11 depicts the same cross-section, with a further layer of first material covering all surfaces.
Figure 12:
FIG. 12 depicts the same cross-section, with the layer of first material removed from all non-vertical surfaces.
Figure 13:
FIG. 13 depicts the same cross-section, with a further layer of second material covering all surfaces and closing the last gap in the trench.
Figure 14:
FIG. 14 depicts the same cross-section, with ribbons of second material alternating with ribbons of first material left in the trench.
Figure 15:
FIG. 15 depicts the same cross-section, with the first material surface below the bottom of the structures of second material, and the blades of first material removed.
Figure 16:
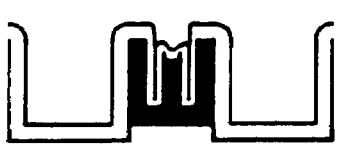
FIG. 16 depicts the same cross-section, with a new layer of first material covering all surfaces.
Figure 17:
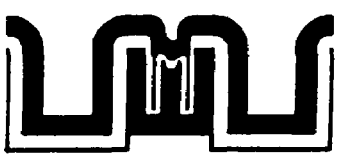
FIG. 17 depicts the same cross-section, with a new layer of second material covering all surfaces.
Figure 18:
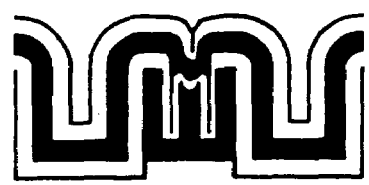
FIG. 18 depicts the same cross-section, with a further layer of first material covering all surfaces.
Figure 19:
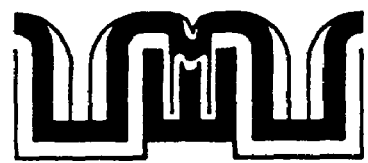
FIG. 19 depicts the same cross-section, with the layer of first material removed from all non-vertical surfaces.
Figure 20:
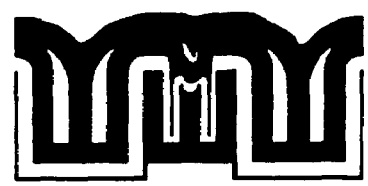
FIG. 20 depicts the same cross-section, with a further layer of second material covering all surfaces and closing the last gap.
Figure 21:
FIG. 21 depicts the same cross-section, with ribbons of second material alternating with interstices of first material.
Figure 22:
FIG. 22 depicts the same cross-section, with the first material removed from the interstices.
Figure 23:
FIG. 23 depicts the same cross-section, with the bridges of second material at the bottom of the ribbons removed.
Figure 24:
FIG. 24 depicts the same cross-section, with the interstices between the ribbons deepened into the first material at the bottom.
Figure 25:
FIG. 25 depicts the same cross-section, with the ribbons of second material removed.
Figure 26:
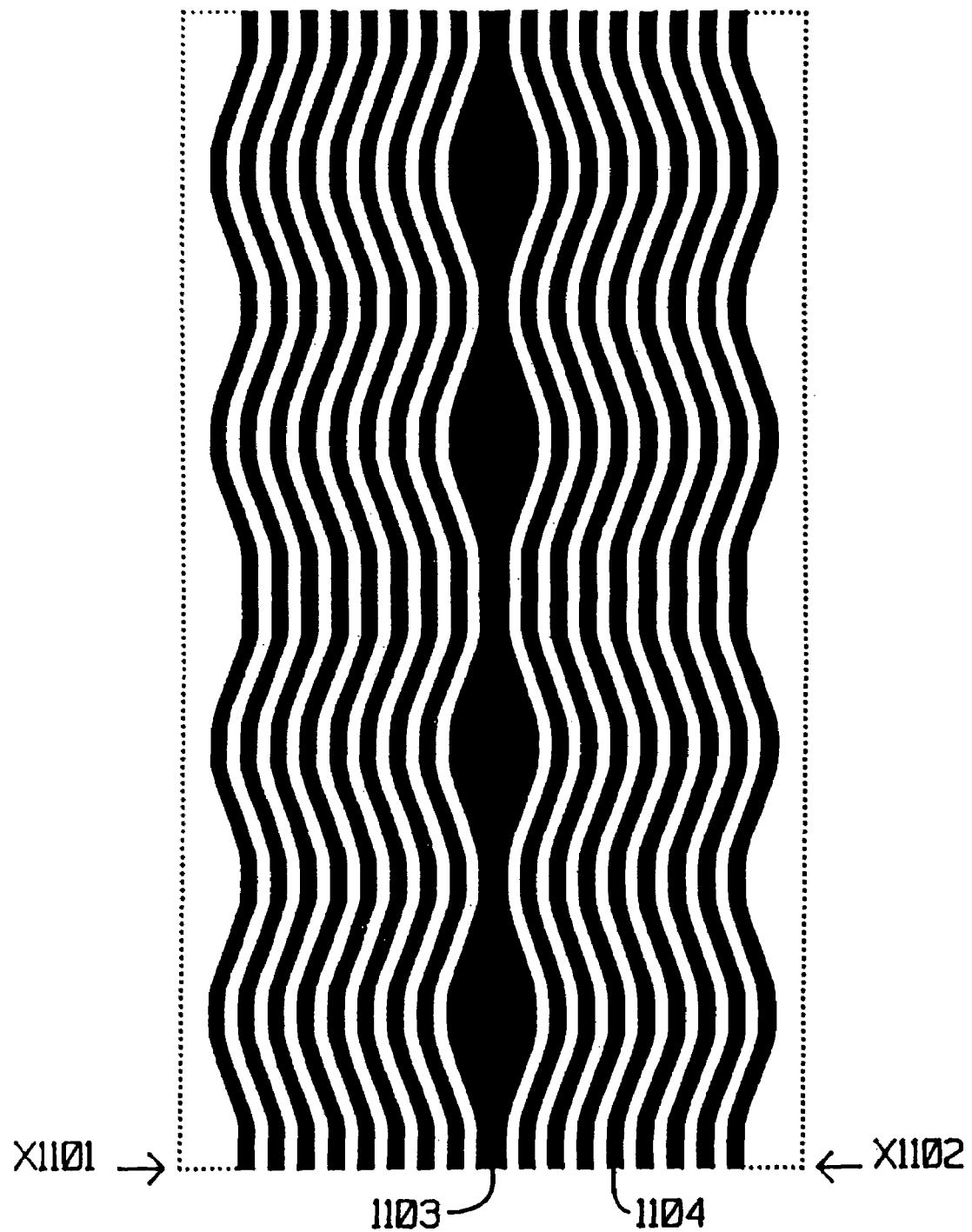
FIG. 26 and FIG. 27 depict a top view and a cross-section, respectively, of a group of ribbons of a second material on top of a substrate of a first material.
Figure 27:

FIGS. 6, 7 and 8 depict the results of the preceding step where UB1 indicates the aforementioned bit lines, and the overall FIGS. 6, 7 and 8 depict a cell and surrounding region of the completed SRAM circuit.

Completed Structures:

As shown in the foregoing process step sequence:

{UB-2} Multiple layers of horizontal circuit traces in an integrated circuit can be created without the use of photolithography.

{UB-3} These multiple layers of horizontal circuit traces can be fabricated so as to extend in multiple horizontal directions.

{UB-4} An integrated circuit can be wired in both horizontal and vertical directions without use of photolithographic masks which have the pattern of this wiring.

{UB-5} An integrated circuit which includes a plurality of transistors can be constructed on a pillar which is of continuous single-crystalline structure.

{UB-6} An integrated circuit comprising multiple transistors which is constructed of components stacked vertically on continuous crystalline pillars can be wired with both multiple vertical and multiple horizontal conductive traces. This can be done without photolithography.

{UB-7} A portion of an integrated circuit comprising multiple transistors can be stacked on single-crystalline pillars, with multiple vertical interconnections between said transistors and multiple horizontal interconnections between transistors of adjacent pillars, so as to make a complex three-dimensional integrated multi-transistor circuit.

{UB-8} A complex three-dimensional integrated circuit can be constructed of groups of components which include multiple transistors whose alternately doped regions are made from continuous crystal, these multiple transistors being arranged in a first axis, this first axis extending into a first dimension, where these components are interconnected by conductive circuitry extending in a plurality of axes, said plurality of axes extending into second and third dimensions.

It will be apparent upon inspection of FIG. 2 that the lower structure (from layers 10P through 2P) extending below layer 11N, and the upper structure (from layers 12P through 20P) extending above layer 11N, are in fact the same structure wiring pattern, where the upward extending wiring pattern is the reverse image of the downward extending wiring pattern, these extensions being symmetrical in pattern.

{SCHM-1} As shown in FIGS. 2 and 6, 7 and 8 and the aforementioned fabrication step sequence, it is possible to construct a microelectronic integrated circuit where a wired vertical structure comprising at least a plurality of semiconductor devices embodies a portion (one-half in this case) of the complete circuit (such as the circuit of a memory cell), and where a plurality (two in this case) of such structures placed in close proximity (adjacent in this case) to one another are interconnected so as to create the complete circuit (as shown connected end-to-end in this example).

IV. Pillar Masking Techniques

Masks for making pillars below the lithographic limit can be created by making groups of lines in two orthogonal axes as follows:

{GRILL-1} An integrated circuit fabrication mask made up of groups of three equally spaced adjacent lines can be created without use of a photolithographic mask of these lines.

{GRILL-2} These groups of equally spaced adjacent lines can be fabricated with each group occurring in one of a plurality of parallel trenches.

{GRILL-3} Groups of three equally spaced adjacent lines can be created between prior existing groups of three equally spaced adjacent lines, all created without a photolithographic mask of any of these equally spaced adjacent lines.

{GRILL-4} Regular repetitions of etched trench and raised portions can be converted to higher spatial frequency repetitions of six trenches and raised portions for each prior trench and raised portion, without use of an intermediate photolithographic step.

{GRILL-5} Iterations of this process can allow repetitive line spacing division of parallel lines by six, in less than 18 deposition or etch steps per divide by six iteration.

{GRILL-6} These lines may be used as an integrated circuit fabrication mask.

{GRILL-7} Alternatively, by not varying or varying the sidewall deposition thicknesses in the sequence preferred, these mask lines may be fabricated with equal widths, or with unequal widths so as to make resulting lines of variable (such as alternating) widths, for example.

{GRILL-8} Substrates may be etched from such mask technology so as to form pillars in the substrate at dimensions smaller than the minimum photolithographic feature size used.

{GRILL-9} Parylene may be used as a subsequently easily removable (selectable) material when fabricating the open regions of such a mask. <Par. 1043> <through Par. 1063>

Substrates may be etched from such mask technology so as to form pillars in the substrate at dimensions smaller than the minimum photolithographic feature size used, at a smaller size than the minimum feature size used in the photolithographic steps, as follows:

{RIBBON-GROUPS-1} Multiple groups of horizontal lines of like trench and raised portion spacing (partition ribbon groups) running adjacent and approximately parallel to opposing vertical walls of a trench can be fabricated without use of a photolithographic mask, these line groups being separated from each other by a filler region between them of potentially different dimensions, so that the minimum to maximum width variation of this filler region fills the nonuniformity spacing difference between the walls of the trench.

{RIBBON-GROUPS-2} These lines may be used as an integrated circuit fabrication mask.

{RIBBON-GROUPS-3} Alternatively, by not varying or varying the sidewall deposition thicknesses in the sequence preferred, these mask lines may be fabricated with equal widths, or with unequal widths so as to make alternating width resulting lines, for example.

{RIBBON-GROUPS-4} Substrates may be etched from such mask technology so as to form pillars in the substrate at dimensions smaller than the minimum photolithographic feature size used.

{RIBBON-GROUPS-5} Parylene may be used as a subsequently easily removable (selectable) material when fabricating the open regions of such a mask. <Par. 1070> <through Par. 1081>

Substrates may be etched from such mask technology so as to form pillars in the substrate at dimensions smaller than the minimum photolithographic feature size used in accordance with the orthogonal masking technique described in the aforementioned discussion of divide-by-six grill masks.

V. Periphery

When pillar structures have been fabricated on a pitch which is at or above the available lithographic limit, then conventional lithographic interconnection means can be used to link to the various structures as desired. When connecting to higher and lower structures of the cell array, conventional V etch techniques which expose continuous features at various heights with horizontal displacement proportional to the angle of the "V" are probably the most convenient historical technique to align continuous feature ends with planar interconnection points.

In the following step sequence, many new capabilities are provided for interconnecting and accessing circuitry formed below the photolithographic limit to conventional circuitry formed at or above the photolithographic limit.

Per

It is possible to provide two patterns in a masking layer of an integrated circuit wafer by photolithographic image transfer, where the first pattern provides a first set of reference locations for elongated structures with spacings and widths below the photolithographic limit, and a second pattern which serves as a primary second reference location for the core of a wall, which in turn serves as a reference location for the end of the elongated structures and for via structures.

It is possible to provide a set of parallel, elongated structures submerged below the surface of the wafer, with widths and spacings below the photolithographic limit and aligned with the first set of reference locations, where the submerged structures consist of at least an insulated conductive trace each, the ends of which are determined in relation to the second reference location.

It is possible to provide a set of second reference locations derived from the primary second reference location by increasing the thickness of a wall, built upon the core located at the primary second reference location, in steps of well controlled thicknesses, where the locations of the edge of the wall at these thicknesses serve as the set of second reference locations.

It is possible to fabricate a set of insulated, conducting vias aligned by virtue of the first set of reference locations with the submerged structures, where each via conductor contacts one of the conductive traces.

It is possible to space the insulated, conducting vias along the conductive traces at distances larger than the photolithographic limit, where these distances are referenced to the set of second reference location and are achieved by non-photolithographic techniques of self-aligning to the core of the wall.

It is possible to provide a set of vias spaced above the photolithographic limit and contacting one by one a set of conductive traces spaced below the photolithographic limit such as to provide a fan-out structure from sublithographic dimensions to larger than minimum photolithographic dimensions. <Par. 1092> <through Par. 1178>

End:

It is possible to provide a pattern in a masking layer of an integrated circuit wafer by photolithographic image transfer, where the pattern simultaneously provides a first set of reference locations for elongated structures with spacings and widths below the photolithographic limit, and a second reference location for the end of said elongated structures and for via structures.

It is possible to provide a set of parallel, elongated structures submerged below the surface of the wafer, with widths and spacings below the photolithographic limit and aligned with the first set of reference locations of the masking pattern, where the submerged structures consist of at least an insulated conductive trace each, the ends of which are determined by the second reference location.

It is possible to fabricate a set of insulated, conducting vias aligned by virtue of the first set of reference locations with the submerged structures, where each via conductor contacts one of the conductive traces.

It is possible to space the insulated, conducting vias along the conductive traces at distances larger than the photolithographic limit, where these distances are referenced to the second reference location provided by the masking pattern and are achieved by non-photolithographic techniques of self-aligning.

It is possible to provide a set of vias spaced above the photolithographic limit and contacting one by one a set of conductive traces spaced below the photolithographic limit such as to provide a fan-out structure from sublithographic dimensions to larger than minimum photolithographic dimensions. <Par. 1185> <through Par. 1218>

Fan:

It is possible to provide a pattern in a masking layer of an integrated circuit wafer by photolithographic image transfer, where the pattern simultaneously provides a first set of reference locations for elongated structures with spacings and widths below the photolithographic limit, and a second set of reference locations for the ends of said elongated structures and for via structures, the reference locations of the second set being spaced above the photolithographic limit.

It is possible to provide a set of parallel, elongated structures submerged below the surface of the wafer, with widths and spacings below the photolithographic limit and aligned with the first set of reference locations of the masking pattern, where the submerged structures consist of at least an insulated conductive trace each, the end of which is determined by one of the second set of reference locations.

It is possible to fabricate a set of insulated conducting vias aligned by virtue of the second set of reference locations with the ends of the submerged structures one by one, where each via conductor contacts one of the conductive traces.

It is possible to provide a set of vias spaced above the photolithographic limit and contacting one by one a set of conductive traces spaced below the photolithographic limit such as to provide a fan-out structure from sublithographic dimensions to larger than minimum photolithographic dimensions. <Par. 1224> <through Par. 1251>

On sub-lithographic dimensions: This interface allows lines and spaces fixed to ⅓ the minimum feature dimension of a lithographic process, because a line and two spaces fit into the narrowest end region of the trench, the width of which can be at the lithographic limit. In fact, the lines and spaces are only ⅓ of the width of the trench left after oxide deposition at step FAN2, which is less than ⅓ the lithographic limit. However, even assuming that the thickness control of deposited layers is much better than the dimension tolerance of photolithography, the entire photolithographic tolerance appears in the width of the center feature of each step of the taper. This center feature is an insulating spacer, except at the narrowest end where it is the conductor trace. While conductors and insulators can stand more tolerance than dimensions which determine transistor characteristics, the center spacer of the full-width trench may be a trench of the cell array, where accuracy of width is important and may require backing off from the minimum feature size possible. One of the favorable aspects is the ability of making the steps of the taper smaller than the photolithographic limit, because the different widths of the initial opening track very closely with one-another, and in a given taper the deviations of all widths of the opening from their nominal values are the same. These deviations are random from wafer to wafer, from chip to chip, and from trench to trench, with decreasing standard deviation.

On information transfer with photolithography: We are using photolithography in an unconventional way, because we transfer information regarding which of multiple vertical wiring patterns we wish to select. In our cell technology the information is contained in the width of the trenches, leading to A-, B-, C- and sometimes D-trenches. In the stepped taper, the widths convey the information on number of lines remaining, while the steps contain the information for the locations of the vertical vias. Thus, information is contained in both the horizontal and the vertical features of the taper pattern. This saves the complexities of defining via locations by thicknesses of deposited layers.

VI. Pillar-to-Pillar Interconnections

As subsequently described, it is possible to create the equivalent of a schematic cross-over or "X" connection which in this case interconnects electrical contact points at the tops of two (2) adjacent pillars. No further lithography is used to do this beyond the initial lithographic step which defined the pillars. <Par. 1256> <through Par. 1322>

As subsequently described, it is possible to selectively coat the sides of vertical structures such as pillars so as to leave coated or exposed regions in desired locations without lithography. These coated or exposed regions may be used insulate or permit electrical contact to underlying regions, thereby permitting selective electrical contact by subsequently applied wiring. <Par. 1324> <through Par. 1365>

VII. Scaling Down

In the aforementioned drawings as subsequently discussed, dimensional relationships shown in the drawings represent relative scaling of the structures shown in one anticipated embodiment. These dimensions may be varied according to engineering preference. SCALING DOWN OF WIRING PLANAR SURFACE AREA: <Par. 1368> <through Par. 1380>

Scaling Down of Power Distribution:

As described earlier in the process descriptions for the 20-layer pillar memory cell (C1.12) through (C1.22), and also for the previously discussed folded-over 11-layer variation on this cell, gridded electrical power distribution conductors are created at various levels in the described integrated circuit structure. These conductors electrically connect and supply electrical power to various transistors (FETs in this case) in the integrated circuit. These conductors supply electrical power to 1, 2, 3, 4, 5 or as many as 6 transistors together on a given pillar, depending on whether one considers a short section of the pillar, or all of the pillar. <Par. 1384> <through Par. 1390>

Scaling Down of Multiple Transistor Circuits:

As described earlier in the process descriptions for the 20-layer pillar memory cell (as in FIGS. 6, 7 and 8, the preceding figures, and in the supporting text for these figures), and also for the previously discussed folded-over 11-layer variation on this cell, multiple transistors (FETs in this case) are created at various levels in the described integrated circuit structure. In this structure, 1, 2, 3, 4, 5 or as many as 6 transistors are formed together on a given pillar, depending on whether one considers a short section of the pillar, or all of the pillar. <Par. 1393> <through Par. 1400>

Scaling Down of Periphery to Cell Array Interface:

As described earlier in the process descriptions for the previously discussed periphery to cell array interface, an interface is created which interconnects smaller scale conductive traces (memory cell control lines in this case) which may be fabricated below the lithographic groundrule limit to larger scale circuitry (peripheral circuitry in this case) which may be fabricated at or above the lithographic groundrule limit. <Par. 1404> <through Par. 1410>

Scaling Down of Cross-Over Circuit Interconnections:

As described earlier in the process descriptions for the previously discussed folded-over 11-layer variation on the 20-layer memory cell, a cross-over interconnection is created which interconnects opposing sides of a pair of adjacent pillars. This described pair of interconnective linkages serves the schematic equivalent function of an "X" wiring interconnection. <Par. 1413> <through Par. 1422>

VIII. Cusp Reduction: <Par. 1424> <Through Par. 1426>

IX. Sub-Lithographic Capabilities

A primary described tool for sub-lithographic fabrication in this specification is the use of thin depositions on sides of pillar structures. By placing the thin depositions on the outsides of the pillars, rather than in holes as in other publicly known examples, the ability to reduce the number of masked groundrule squares for a given structure is enhanced. <Par. 1429> <through Par. 1430>

It will be apparent that these advantages apply to any number of transistors which comprise the pillar, even to a single transistor.

Artificial SOI:

X. Improved Substrate Isolation

It is possible to improve the isolation between the substrate and the bottoms of the pillar structures by using an insulator rather than a diode isolation technique as follows: The surface of a wafer (silicon in this example) is ribbon masked in a first axis so as to make trenches which are continuous for a limited distance. These trenches are similar to those previously described with the ribbon mask example, but in this case masking is also done so as to interrupt the continuous progression of the trench. The masks for these trenches may be conventional or whatever kinds of masks are desired, not just the ribbon masks of the type previously discussed, although those ribbon masks could be used in a second orthogonal axis as before, but at a decreased spatial frequency (farther apart), to create the interruptions desired in the first orthogonal axis. In any event, the engineer may select a preferred means of masking with a single mask, or with combinations of masks.

By subsequently processing these trenches in the first axis before pillars are formed by masking in a second orthogonal axis, an insulated region can be created at the bottom of what will subsequently become a row (or rows) of pillars, as follows: A first selectable material (such as silicon dioxide) is deposited on the walls of the trench above a second selectable piston material (such as Parylene or resist), and the tops and bottoms of the sleeve deposition are removed by vertical directional etching as discussed earlier, leaving a sleeve as in the earlier examples. The second selectable piston material is then etched down to a slightly lower height, exposing the sides of what will become the bottoms of the pillars. As long as the trenches do not extend for too long a distance (i.e. interrupted soon enough), then the intervening lamellae of pillar material will be adequately supported at both ends, so as to permit the following operation. By next omni-directionally selectively etching away the exposed bottoms of the lamellae of pillar material, the lamellae can be made to be suspended freely between their supporting ends, where the interrupting mask pattern limited the length of the trenches.

An insulative material can then be applied so as to fill the open regions below the suspended lamellae. By applying a liquid such as resist which is subsequently hardened, and then etching it down in the manner of a piston as previously described, the remaining hardened liquid can form an insulative region below the lamellae, thereby electrically isolating them from the lower substrate, while at the same time providing them with a means of mechanical support at their bottoms. Once this has been accomplished, the lamellae can then be masked and etched in an axis orthogonal to the first trenches, leaving pillars of whatever preferred long or short length, where these pillars can be mechanically free standing (or subsequently wired or otherwise supplemented) while remaining insulated from the substrate.

Lamellae can also be masked so as to allow filling the trenches between pairs of lamellae with a selectable support material, a closed-out deposited material for example (such as Parylene, or other deposited materials mentioned earlier, or otherwise in common use) or a liquid which can be solidified (a polymer such as resist, etc.). This support material can be kept in place by masking or etch selectability against the other exposed materials, and then later removed by conventional selective etchants, or by conventional masking and using a conventional etchant to trench etch the support material against the mask. This allows the lamellae to be made much longer where desired.

Here, and elsewhere in this specification, resist (microlithographic photoresist) is mentioned as an example of a liquid phase deposited polymer material that can be solidified, which is publicly known to be used in these types of applications for reasons other than photolithographic patterning purposes. Readers not skilled in this art should be aware that the resists are used because they are polymers that are adaptable to these types of applications, not because they can be patterned by masked light.

XI. Clarifications and Supplemental Techniques

The preceding and subsequent disclosures are illustrative of general methods and structures which are not specific to the applications shown. The invention is not limited to the specific details of these illustrative examples. All materials called out are intended to be illustrative, and substitute materials can be used where desired in accordance with engineering preference.

NON-SILICON-BASED SEMICONDUCTOR MATERIALS:

BIPOLAR TRANSISTORS:

INCREASED SPEED AND POWER:

"CHEMICAL-MECHANICAL POLISHING":

ATOMIC LAYER EPITAXY (ALE) depositions may be used as substitutes for other required omni-directional depositions wherever the atomic layer epitaxy deposited materials can serve the functions of the materials for which they substitute, particularly where very thin coatings are desired.

PISTON MATERIALS:

"U" STRAPS: When two pillar structures are intended to be linked into a single common circuit structure along the general type of layout described above, it is also possible to conductively link adjacent layers at the same height.

THRESHOLD ADJUSTMENT METHODS:

DIFFUSED PILLAR TRANSISTOR STRUCTURES: When single or multiple vertical gaps are etched in a coating of a suitable diffusion masking material such as silicon dioxide or silicon nitride, then diffusion doping can be performed on the pillar sidewalls.

VERTICAL WIRING SPLICES: to "splice" an overlying layer to an underlying layer later in a fabrication process where desired.

Cross-Over ("X") Connections:

FOLDED HALF-HEIGHT PILLAR STRUCTURES: It will be apparent that the vertical wiring shown on each side of the pillar in FIG. 8 from layer 11N down to layer 2P is a topological reflection of the wiring pattern extending up on the opposite side of the pillar from layer 11N to layer 20P. Therefore, if two pillars which equate to lower portions of the pillar shown (from layers 11N down to layer 2P and also 1N) are placed side by side (with A trench wiring on the same sides and B trench wiring on the opposite sides of such a pair of half-height pillars), then all elements of the original single vertical pillar and its wiring are present except for the continuation linkage of the wiring going up one side of one pillar, where the wiring must link and continue down the opposite side of the adjacent pillar in the pair. If a cap of an insulative deposition (such as silicon dioxide or silicon nitride) is patterned by conventional masking onto the top of the pillar (above the middle of layer 11N), then, using the splice technique described herein for example, the vertical wiring on the opposing sides of each pillar in the pair above layer 11N can be extended upward to the height of the thickness of such a top insulative layer. The top of the whole structure can then be planarized or chemically-mechanically polished as necessary so as to leave 4 wiring contact points exposed at the top of the pair of pillars. When the intervening trenches are filled with a suitable material (such as hardened liquid polymer for example), then conventional or other patterning means (such as the cross-connect means described herein) can be used to deposit an "X" or topologically equivalent cross-over cross-connection, so as to complete the pillar pair wiring structure to the equivalent of that in FIG. 8. This can be used in conjunction with the C trench processing previously described for the C trench at and below layer 11N. As an option, portions of the layer 11N to 2P structure can be deleted during fabrication by simply not including any undesired layers, and also bypassing, shortening, or otherwise modifying processing for their adjacent features. By deleting transistors in this manner, the structure can be reduced to a 4 transistor SRAM cell structure, but without the normal pull-up resistors included at this point. These pull-up resistors can be constructed by conventional planar fabrication or other processing means at the top of the structure, and linked down to desired wiring points by the aforementioned splice technique, where the splice wiring creates upper contact points for these resistors.

SUB-LITHOGRAPHIC CROSS-CONNECTIONS. CROSS-Connections which electrically form an "X" linkage can be constructed for such purposes as linking the tops of pillars where such a connection is desired, without lithography or sub-lithographically, as follows:

In the following step sequence, materials A and B are materials which are selectable from one another using selective etchants of engineering preference. Columnar or other directional sputtering of gold (A) and tungsten (B) is assumed for the directional depositions, and CVD of tungsten is assumed for the omni-directional box depositions in the following step sequence. If A is gold and B is tungsten, this will work particularly well with conventional selective wet etchants, for example. If the trench is made shallower, this can enhance the removal of wet etchants: roughly comparable face height to trench width ratio, for example. Vapor or RIE etchants may also be used, particularly where conventional methods of varying thicknesses of depositions are used to compensate for etch selectivity rates. As elsewhere, materials other than A and B may be varied according to engineering preference.

At any subsequent sequence step where depositions leave unwanted depositions on bottom regions, or lesser depositions on any exposed side surfaces, brief back etches may be used to vertically etch any unwanted materials from bottoms, or to remove any unwanted materials from any exposed walls/faces.

Figure 28:
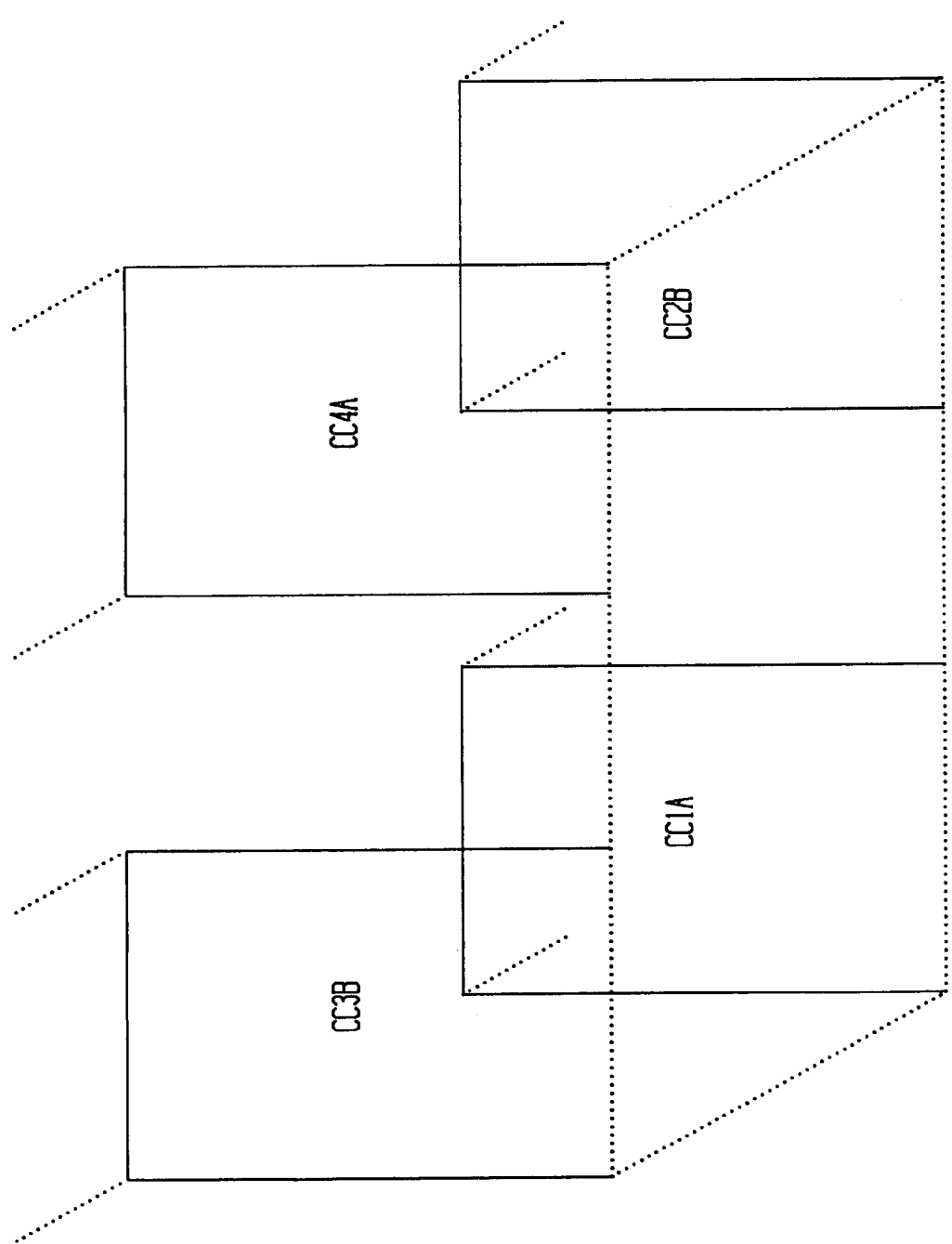
FIG. 28, FIG. 29 and FIG. 30 depict pairs of opposing pillar faces which become cross-connected.

FIG. 28 depicts two pairs of co-planar faces CC3B and CC4A, and CC1A and CC2B, respectively, of two pairs of side-by-side pillars, where each pair of pillar faces confronts the other pair across an intervening trench. This intervening trench would typically extend further to the sides, so as to intervene between subsequent additional pairs of like pillar faces.

Figure 29:
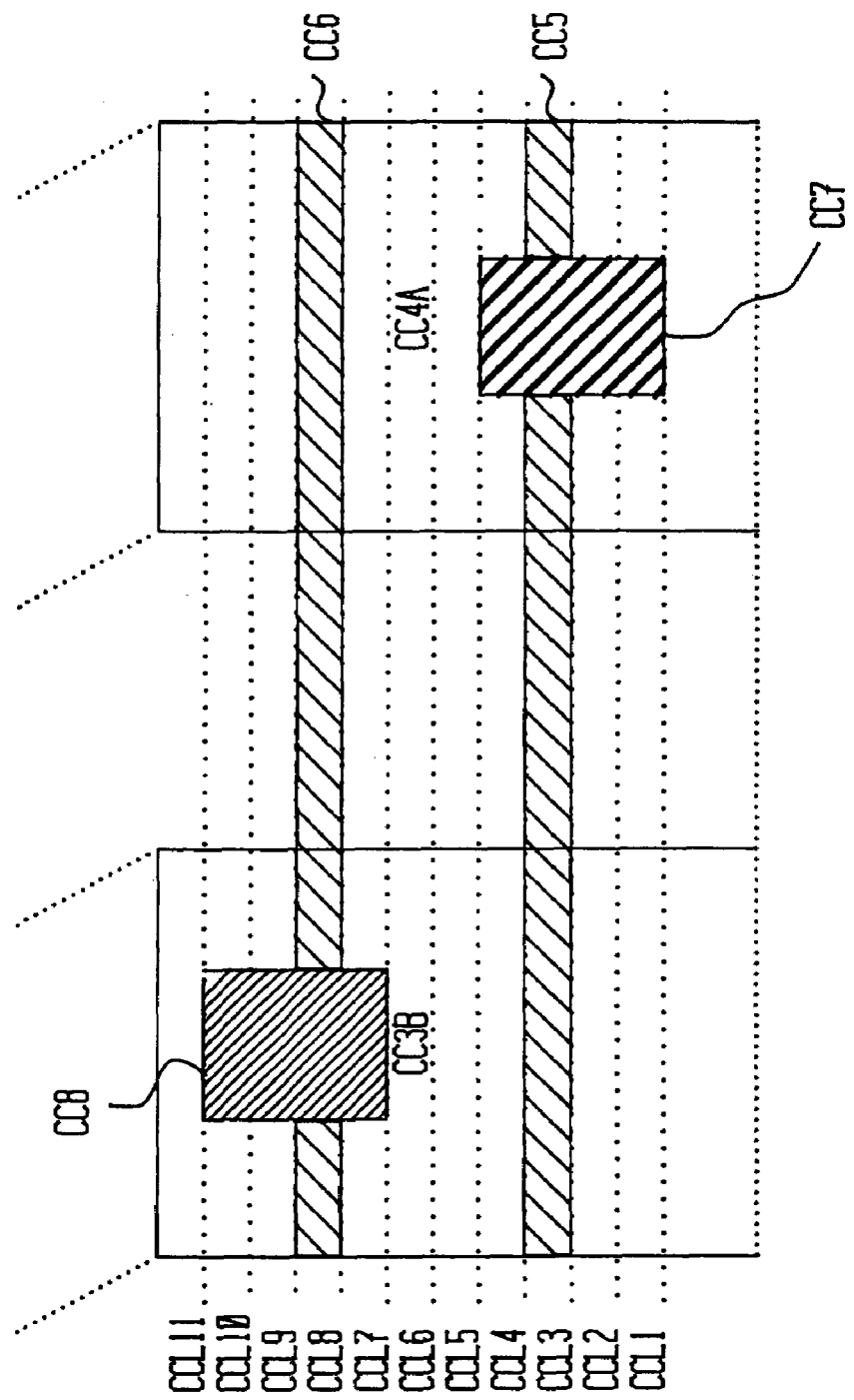

FIG. 29 depicts the pair of co-planar pillar faces CC3B with CC4A previously shown in FIG. 28, with levels CCL1 through CCL11 depicted by horizontal dotted lines to show piston and/or sleeve heights to be subsequently discussed in the following step sequence. In FIG. 29, first hatched sections CC5 and CC6 depict discontinuities (openings) in a silicon dioxide coating which covers continuous conductive regions or layers on each pillar face behind the oxide. The first exposed portion of this continuous conductive region (opening CC5) is between levels CCL3 and CCL4, and the other exposed portion of this continuous conductive region (opening CC6) is between levels CCL8 and CCL9. Such a continuous conductive region behind the oxide may be a conductive coating, or the pillar itself. In the following step sequence example it is assumed to be a doped polysilicon coating on the faces shown, where the pillar behind this coating has been fully coated with insulative material, such as silicon dioxide. Such a continuous conductive region behind the oxide would extend down below the shown features, so as to connect with vertical wiring or other conductive regions extending upward from lower (not shown) structures created earlier, such as additional (lower) co-planar pillar faces.

Note that in the following step sequence, the bottom of the intervening trench is either created of an etch selectable material, or piston height settings must not be lowered to the nominal bottom of the trench, rather than totally removing the piston where material below such piston heights needs to be protected.

The fabrication step sequence is as follows:

Prepare Selectable Face Contacts:

Liquid fill pillar interstices: The trench between pillar faces CC1A and CC2B and pillar faces CC3B and CC4A is filled with hardened liquid polymer as follows: First the trench regions are filled with hardened liquid polymer. Then the planar region above pillar faces CC1A and CC2B, and also above faces CC3B and CC4A, is masked with a planar silicon nitride mask (which may be sub-lithographic). The hardened liquid polymer is then vertically etched down by such means as selective RIE or chemical milling, so as to leave hardened liquid polymer between the pillars faced by CC1A and CC2B, and also CC3B and CC4A. The silicon nitride mask may then be removed.

Angle deposit A on CC3B & CC4A: A directional deposition of material A (gold) is made at a backward angle down and toward pillar face CC3B and pillar face CC4A, then back etching can be implemented so as to subsequently clear any unwanted lesser deposition on any exposed sides.

Angle deposit B on CC1A & CC2B: A directional deposition of material B (tungsten) is made at a forward angle down and toward pillar face CC1A and pillar face CC2B, then back etching can be implemented so as to subsequently clear any unwanted lesser deposition on any exposed sides.

Liquid fill: The trench between pillar faces CC1A and CC2B and pillar faces CC3B and CC4A is filled with hardened liquid polymer.

Planarization of hardened liquid polymer: Here, and elsewhere where hardened liquid polymer is used, the liquid may be filled to a height above the top surface, planarized if desired, and then etched back down to a height even with the pillar tops to make the height of the trench fill more accurate.

Mask right side: The planar region above pillar faces CC2B and CC4A (but not above faces CC1A and CC3B) is masked with a narrow planar silicon nitride mask. This mask may be sub-lithographic. Open left side: The hardened liquid polymer in the trench below the gapped (open) portion of the planar silicon nitride mask is then vertically directionally etched by such means as oxygen RIE or selective ion milling, so as to leave the polymer substantially below the silicon nitride mask, but not below the unmasked regions which are to the sides of the silicon nitride mask.

Selectively strip A: The exposed material A (gold) deposition coating pillar face 3B is then selectively etched away.

Selectively strip B: The exposed material B (tungsten) deposition coating pillar face 1A is then selectively etched away.

Remove the masks: The silicon nitride mask and hardened liquid polymer are then selectively etched away.

Liquid fill pillar interstices: The trench between pillar faces CC1A and CC2B and pillar faces CC3B and CC4A is filled with hardened liquid polymer as follows: First the trench regions are filled with hardened liquid polymer. Then the planar region above the pillars incorporating faces CC1A and CC2B, and also above the pillars incorporating faces CC3B and CC4A, is masked with a planar silicon nitride mask (which may be sub-lithographic). The hardened liquid polymer is then vertically etched down by such means as selective RIE or chemical milling, so as to leave hardened liquid polymer between the paired pillars faced by regions CC1A and CC2B, and also between the pair of pillars faced by regions CC3B and CC4A. The silicon nitride mask may then be removed. The trench may then be refilled with hardened liquid polymer as required to facilitate subsequent steps.

Mask right side (wider): The planar region above pillar faces 2B and 4A is masked with a planar silicon nitride mask which is slightly wider than the prior mask over this region. This mask may be sub-lithographic.

Open left side: The hardened liquid polymer in the trench below the planar silicon nitride mask is then vertically etched by such means as oxygen RIE or selective ion milling so as to leave the polymer substantially below the silicon nitride mask, but not below the unmasked regions which are to the sides of the silicon nitride mask.

Angle deposition of B on CC3B: A directional deposition of material B (tungsten) is made at a backward angle down and toward pillar face CC3B, then back etching can be implemented so as to subsequently clear any unwanted lesser deposition on the sides.

Angle deposition of A on CC1A: A directional deposition of material A (gold) is made at a forward angle down and toward pillar face CC 1A, then back etching can be implemented so as to subsequently clear any unwanted lesser deposition on the sides.

Remove the masks: The masking of hardened liquid polymer and silicon nitride (as created earlier) is then etched away.

Liquid fill pillar interstices: The trench between pillar faces CC1A and CC2B and pillar faces CC3B and CC4A is filled with hardened liquid polymer as follows: First the trench regions are filled with hardened liquid polymer. Then the planar regions above the tops of the pillars with faces CC1A and CC2B, and also above the tops of the pillars with faces CC3B and CC4A, are masked with planar silicon nitride (optionally with sub-lithographic masking). The hardened liquid polymer is then vertically etched down by such means as selective RIE, so as to leave hardened liquid polymer between the pillars faced by CC1A and CC2B, and also between the pillars faced by CC3B and CC4A, but with the hardened liquid polymer absent in the intervening trench extending between pillar faces CC3B and CC1A, and likewise between pillar faces CC4A and CC2B (this trench continuing also across the intervening region between these two regions). The silicon nitride mask may then be removed.

Set Up Lower Cross-Connect:

Sleeve the top: The upper sidewall region (all 4 faces) is then sleeved below level CCL7, or optionally level CCL6, with a deposition of silicon nitride so as to expose the lower section (all 4 faces) below level CCL7 or CCL6.

Selectively strip A and B from mid-height: A hardened liquid polymer piston is set at level CCL5, and the exposed vertical faces etched so as to remove materials A (gold) and B (tungsten) from between the bottom of the silicon nitride sleeve at level CCL7, and the top of this piston at level CCL5. The hardened liquid polymer piston is then removed.

Selectively strip B: Material B (tungsten) below the silicon nitride sleeve is then selectively etched away, so as to strip away the results of the two directional material B angular depositions made during the two prior material B angular deposition steps.

(optional): The silicon nitride sleeve may optionally be removed at this point.

Sleeve the top (lower sleeve): The top (all 4 faces) is then sleeved with silicon nitride, so as to leave the lower section (all 4 faces) below level CCL2 exposed, thus exposing the bottom of conductive interconnect CC7 and its counterpart (not shown) on face CC1A. Interconnect CC7 will extend downward to level CCL1 or below, depending on where the bottom height controlling the piston was set when interconnect CC7 was created. The lower portion of interconnect CC7 will subsequently be linked with an analogous interconnect structure (not shown) on pillar face CC1A, to thereby electrically link pillar faces CC4A and CC1A.

Complete Lower Cross-Connect:

Set box bottom height: A hardened liquid polymer piston is set at (or below) level CCL1.

Make tungsten box: An omni-directional coating of tungsten is deposited so as to make a "box" between the side walls and end walls and the piston height (level CCL1 or below) at the bottom of the open trench region. (This box structure may be created by leaving filled the regions past the ends of the trench shown at the left and right ends of the FIG. 28 structure. These regions are kept filled by keeping them protected by appropriate masking during etching down of fill material in the box's interior region.)

Remove upper extension of box: A piston of hardened liquid polymer is set at or below level CCL2, and the tops cleared (selectively etched) of tungsten (but not the silicon nitride), so as to leave the bottom of the box with cross-connecting contacts at pillar face CC4A and pillar face CC1A. Optionally, if the described box structure has not been created, then one or more subsequent masking and vertical etching (RIE, etc.) steps may be used to protectively mask the pillars (whose faces are shown) and intervening trench area shown in FIG. 28, but leaving openings in the mask over the regions to the left and right of the structure shown in FIG. 28. Subsequent vertical etching of these unmasked regions by such means as RIE or ion milling where desired can then sever any conductive traces extending to the left or right of the FIG. 28 structure in such a situation.

Set Up Upper Cross-Connect:

Set up for to clear upper sleeve: A piston of hardened liquid polymer is set at piston to level CCL5, or optionally level CCL6, this piston being above the remaining lower box just formed, where this remaining lower box is to be saved as a conductive linkage cross-connecting the material A (gold) conductive interconnects CC7 (and other interconnect contact not shown) on the lower CC4A and CC1A faces.

Clear upper sleeve: The silicon nitride upper protective sleeve is then removed, so as to leave a gap of silicon nitride between the lower box and upper box to be formed.

Selectively strip A: The exposed material A (gold) above the piston is then selectively etched away, leaving only the material B (tungsten) interconnect contacts on CC3B and CC2B for future use.

Complete Upper Cross-Connect:

Set up bottom of upper box: A piston of hardened liquid polymer is set at a level CCL10, this level being notably higher than the piston level of the prior piston step.

Make upper box: An omni-directional coating of tungsten is deposited, so as to leave the bottom of a second and higher tungsten box, where the lower portion of this box is to be saved as a conductive linkage cross-connecting the material B (tungsten) conductive interconnects CC8 (and other interconnect contact not shown) on the upper CC3B and CC2B faces.

Remove upper extension of box: A piston of hardened liquid polymer is then set at level CCL11, and the regions of tungsten above the piston are selectively etched away, so as to leave the lower portion of this box saved as a conductive linkage cross-connecting the material B (tungsten) conductive interconnects CC8 (and other interconnect contact not shown) on the upper CC3B and CC2B faces.

When desired, truncation of the left and right ends of the now completed structure of FIGS. 28 and 29 may now be accomplished by using such means as a protective mask overlying the shown region of FIGS. 28 and 29. Gaps in this masking exist on the tops of the regions to the left and right of the ends of this extension of the region of FIGS. 28 and 29. Vertical directional etching away of the regions to the left and right of the protective mask by such means as RIE or ion milling then removes the structural regions below these exposed (mask gap) regions to the depth desired. The resulting trenches thereby created then truncate the left and right ends of the region indicated by the extension shown for the structure of FIGS. 28 and 29. These trenches may be closed out with an insulator such as silicon dioxide or silicon nitride, followed by removal of the top (planar) deposition portions of this coating where desired. Or, they may be filled with a flow on material such-as hardened liquid polymer or spin-on-glass, for example.

In the foregoing step sequence, the use of tungsten and gold can be reversed for the vertical conductive interconnects, or reversed or substituted for the box structures where desired, or other conductive materials may be used.

Wiring in Holes within Pillars:

ALTERNATIVE STRUCTURE WITH CROSS-OVER CONNECTIONS: The pillar side wiring and related sidewall structures shown for the A and B trenches leading to the structure of FIGS. 6, 7 and 8 can also be fabricated inside of trench etch created vertical holes using the same process step sequences. For such a case, a pillar can be masked so as to trench etch holes which extend vertically down from its planar top surface into the interior region of the pillar. It will be noted that the wiring and insulation overlay pattern that runs up and down a face of a pillar, such as that shown for the A or B trenches, was formed by first processing the side walls of a vertical trench etched hole, such as the unmasked or exposed hole of the A trench or hole of the B trench. Thus, alternatively, holes trench etched into the interior region of a pillar can be sequentially unmasked and processed following the A or B vertical trench etched hole process step sequences shown, thereby resulting in a wiring and insulator pattern inside each such vertical trench etched hole (in a pillar which contains one or more such holes) which matches the interconnectivity and function performed by the sidewall wiring shown in FIG. 8 for the A or B trenches. When a pillar is fabricated with one such internal corresponding vertical trench etched hole for the A trench wiring, and an additional such internal corresponding vertical trench etched hole for the B trench wiring, and if such a pillar is layered with dopings to match the FIGS. 7 and 8 pillar layers, then such a pillar is wired inside its interior region equivalently to the side wiring shown for the pillar of FIG. 8. In such a case where the word lines end up formed enclosed by their respective internal (hence non-extending) vertical trench etched holes, they can be wired (connected) up to the top surface by adding a splice connection (as described elsewhere herein) which contacts the non-extending word line structure. The upper ends of such word line splice connections can then be connected to conventional planar word lines by conventional masking and via connections. The top of the highest layer 1N the pillar (the upper bit line layer) can be contacted by conventional masking and via connections to conventional bit lines. C trench "U" shaped wiring and insulating stacked layers can be formed following the fabrication sequence described for the C trench processing which led to the C trench structures shown in FIG. 7. However, in this internally wired pillar example, the C trench can be treated as surrounding the pillar on all sides, rather than extending in a single axis. In such a case, where the C trench surrounds all four pillar sides, the lower bit line will be unable to extend outside the region of the bottom of the pillar. An additional hole trench etched in the top surface of the pillar can extend down to reach this bit line layer (2P in this case), and an insulated splice connection (a described elsewhere herein) can contact this bit line layer, and then extend up to the top surface of the pillar where the conductive portion of the splice can be connected to conventional bit lines by conventional masking and via interconnection methods. Conventional planar lithographic techniques can be used to contact the tops of various upward extending conductors. Alternatively, fabrication processing for the word line structures can be deleted from the aforementioned A and B internal pillar vertical trench etched holes, and fabricated instead in their own respective additional vertical trench etched holes which are etched down from the top surface of the pillar. Particularly in the case of the lower word line connection (at layer 3N here), adding an additional vertical trench etched hole can remove the word line splice contact upper wiring extension from undesirably overlapping the other structures along the vertical extension of the pillar. However, in the prior example where word line and bit line shared the same vertical trench etched hole and such overlapping was the case, sufficient standoff insulation deposited and appropriately patterned underlying the splice conductive wiring can prevent electrical interaction between such word line splice wiring and the underlying structures (such as bit lines or FET gates). If upper and lower word line gate control structures are fabricated in the same vertical trench etched hole, then a splice connection can link both of these gate control structures together before continuing to extend up to a top surface contact.

A pillar cell structure with internally wired vertical trench etched holes can be constructed in a planar layout configuration where its vertical trench etched holes are laterally positioned one after the other, in a line. Thus, a pillar can be configured where its planar axis width is just wide enough to accommodate a single vertical trench etched hole, while its planar axis length is extended sufficiently to accommodate multiple vertical trench etched holes. When such a pillar incorporates four internal vertical trench etched holes in a line (planar view), then one such vertical trench etched hole can be used for the aforementioned A trench vertical wiring, one for B trench vertical wiring, one for bit line vertical wiring, and one for word line vertical wiring.

As described elsewhere herein, the pillar cell shown in FIGS. 6, 7 and 8 can be effectively "folded" into two separate pillars by configuring one such pillar as shown for the bottom half of the FIGS. 6, 7 and 8 group structure, and configuring a second adjacent pillar as the top half of the FIGS. 6, 7 and 8 group structure, but where this top half is inverted. In such a paired pillar structure, layer 11N thus becomes the top layer 1N each new shorter adjacent pillar of the pair, and bit line layers 2P and 20P are on the bottoms. Such a paired pillar structure can be configured in this alternative internally wired vertical trench etched hole variation. A valuable variant of this occurs where such a pillar pair is configured with the aforementioned four vertical trench etched holes in each pillar of the pair, where in each pillar these four vertical trench etched holes respectively incorporate the A trench, B trench, bit line and word line vertical wiring. In this variant, the pillars are paired along their planar extension (longer) axis in planar view, so that many pillars can be laid out in a line whose planar view pattern is one vertical trench etched hole wide, but many multiples of pairs of four vertical trench etched holes long. In this example, the vertical hole sequence for the first pillar in each pair is word line, bit line, B trench; then A trench, followed by the hole sequence for the adjacent pillar of the pair in topological reflection being A trench, B trench, bit line, then word line. This one hole wide four (4) plus four (4) hole sequence length pattern is then continually repeated along the line of extension as many times as desired, thus creating a one vertical trench etched hole wide line of paired pillars, with this line extended with as many pillar pairs as desired for the circuit being constructed. Such lines of pillars are then laid side by side, so that the respective bit line, word line, B trench corresponding and A trench corresponding vertical holes are aligned in lines, where such respective lines all extend in parallel to one another, and where each such respective line is orthogonal to the aforementioned repeated pillar pair line of extension.

When interconnecting such structures from above, a coating of insulative material is deposited and patterned on the tops of the pillars, so that the insulated upward wiring in the vertical trench etched hole can be contacted by such means as conventional vias.

In such a planar view layout configuration, when such structures are constructed with dimensions larger than the lithographic groundrule, then bit lines can be fabricated by using conventional via contacts to the bit line source/drain contact wiring in the bit line related vertical trench etched holes, and then conventionally fabricating planar bit line runs in the previously indicated side-by-side repetition axis of bit line holes. Or, bit line vias can simply contact source/drain material when it is located at the top semiconductive layer of the pillar structure without the use of a hole. In a similar manner, word lines can be fabricated using conventional via contacts to the word line gate contact wiring in the word line related vertical trench etched holes, with word line runs contacting such vias, where such word line runs extend orthogonally to the bit lines, i.e. in the pillar pair line of extension. Since the word line related vertical trench etched holes in this example are directly adjacent to one another, at the ends of the pillar pair vertical trench etched hole sequences, they may be lithographically strapped or linked together, thus allowing a single via which reaches down to contact such a strap to link simultaneously to a word line contact of both a preceding and a following pillar pair along the pillar pair line of extension. Use of such a single via can maximize the intervening space between such word line vias for use of this space in the orthogonal axis by bit lines. Such bit lines can be formed by conventional lithographic techniques in a side-by-side configuration, or alternatively above one another using additional conventional layered fabrication techniques, such as CMP. If such vertically stacked bit lines are positioned so that each line has a portion which vertically overlies its associated line of bit line vertical trench etched hole contact regions, then conventional vias which reach down to such contact regions can themselves be contacted at the via tops by such bit lines which overlie such vias and contact regions. Respective bit line runs in such vertically stacked bit line pairs may be laterally offset from each other in the planar axis, orthogonal to the axis of bit line extension, thereby reducing the effective proximity of one bit line to the other by more than just the vertical spacing between such lines. In this manner capacitive interaction between such bit lines can be further reduced. The word line runs extending orthogonally to the bit line run axis may also be placed similarly above their laterally sequential rows of via contacts, such contacts extending up between the bit lines for example, thereby having higher word lines offset from lower word lines in a manner similar to the aforementioned bit line relationship.

Figure 30:
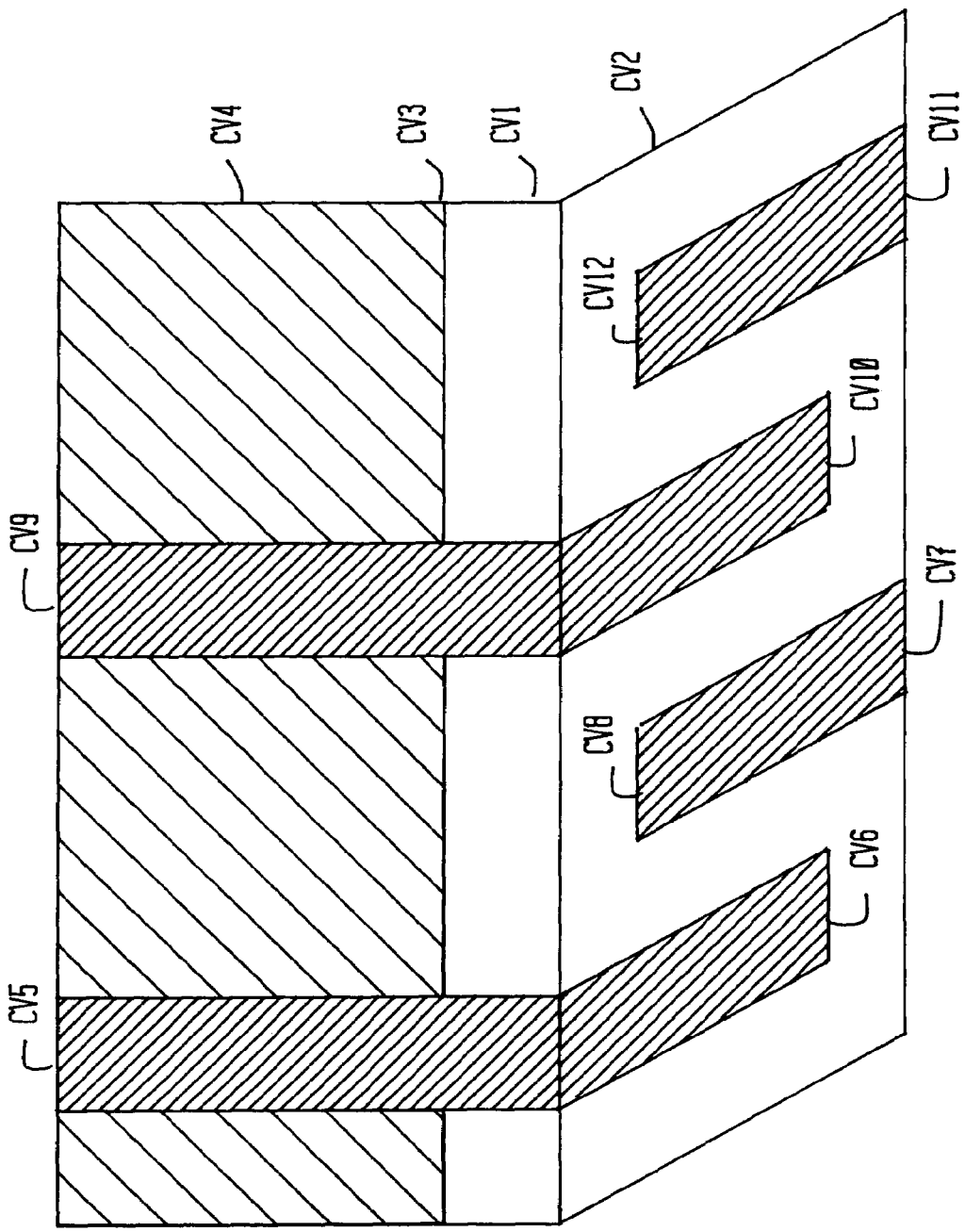

In cases where contacts (such as the aforementioned A and B trench corresponding hole contacts) are not arranged directly adjacent to one-another, such as the in-line pillar pair vertical trench etched hole sequence described above, then such contacts can be linked as desired by conventional lithographic methods. Alternatively, in cases such as the above, such contacts can also be linked sub-lithographically. In the above pillar pair case, at least one first contact requires linkage to another second contact which is positioned on the far side of one or more intervening contacts, where such linkage effectively bypasses the intervening contacts. Preferably such a bypass will add minimal additional area to the planar layout. Such a bypass can be formed without lithography, and hence potentially sub-lithographically as with other non-lithographic structures described herein, as in part or all of the following double bypass example:

FIG. 30 depicts a back wall and bottom of a trench with interconnect features, with its left and right ends defined, for example, by orthogonal trenches. The structures forming the back wall (and front wall not shown) would typically be repeated many times, to the left and right, in the direction of the trench, with adjacent structures always separated by orthogonal trenches. The structures would also be repeated many times in the forward and backward directions.

The interconnect features of FIG. 30 are fabricated in a trench, the walls and bottom of which are covered with a selectable insulating material, such as silicon nitride, or otherwise coated with a deposition of such an insulator, so as to prevent electrical contact to adjacent and underlying electrical structures in any location where such electrical contact is not intended. For the purpose of the following fabrication step sequence, the trench of FIG. 30 ends at the left and right ends as shown, where these ends are formed by reference structures such as orthogonal trenches of equal depth to the main trench. The ends of the trench can be used as spatial references for further fabrication processes.

A piston of hardened liquid polymer is set in a trench at a height CV3 as shown on far wall CV1.

A deposition of a first selectable conductive material CV4, such as doped polysilicon (or optionally gold) in this case, is omni-directionally deposited over all exposed surfaces by such means as CVD.

Vertical directional etching by such means as RIE or ion milling is used to remove the exposed polysilicon coating CV4 from the horizontal surfaces.

The polymer piston may now be selectively etched away, if desired, so as to expose the trench bottom CV2, leaving polysilicon coating CV4 coating the far wall as shown, as well as the near wall at the same height (not shown), and the side walls (not shown) which will be subsequently etched away when this structure is truncated at its left and right ends.

The trench is now filled to the top with hardened liquid polymer, using conventional flow on and planarization techniques.

A suitably high vertically sided mask trace of a selectable material such as silicon dioxide is deposited and patterned by conventional or sub-lithographic techniques, so as to extend across the left end of the trench (and further across any adjacent trenches being fabricated before or behind this trench), this mask trace covering the region immediately to the left of the trench, but leaving the trench itself unmasked. The edge of this mask trace is directly over the left edge of conductive link CV5.

Repetitive Loop:

The hardened liquid polymer in the trench is selectively vertically etched down anisotropically, so as to expose the bottom of the trench to the right of the vertical etch wall thereby created. Here and as follows, this process can be supplemented by using the hardened liquid polymer with appropriate photo-sensitizer, and exposing it to illuminating radiation, so as to leave the polymer under the mask resistant to the etchant, but leaving the exposed polymer etchable.

A directional deposition of a second selectable conductor, such as tungsten in this case, is then directionally deposited angled down and toward the far (rear) wall CV1 of the trench, so as to be shadowed by the top of the near wall (which is not shown here) thereby beginning the deposition region at a point CV6 which is a short distance offset away from the bottom of the near wall, and with this deposition extending back across the rest of the trench bottom CV2 and up and over the top of the far wall CV1.

The trench is now filled to the top of the mask trace with hardened liquid polymer, using conventional flow on and planarization techniques.

The polymer fill is selectively vertically anisotropically etched down to the height of the bottom of the mask trace.

An angular directional deposition of silicon dioxide, or a selectable alternative material is then deposited so as to coat the side of the silicon dioxide mask trace, so as to increase its width to make its new edge directly above the right edge of conductive link CV5, then the exposed horizontal surfaces of this deposition are vertically etched away.

The polymer fill is selectively vertically anisotropically etched down so as to expose the trench bottom CV2.

The remaining exposed tungsten coating to the right is then selectively etched away, leaving conductive link CV5 and any sidewall artifact (not illustrated) associated with any off axis depositions of the tungsten. The placement of conductive link CV5 is selected so as to overlie the first vertical trench etched hole in a sequence to be connected by a bypassing or "C" linkage. (Where any sidewall artifact is created, the normally minimal thickness of such coating can be removed by a timed omni-directional selective back etch.)

The silicon dioxide mask trace is then expanded again by angular deposition on the sidewall and vertical etching, so as to place the new mask edge directly over the left edge of conductive link CV7.

End of Repetitive Loop.

The preceding repetitive loop steps are then repeated again, but with the directional deposition coming down and from the opposing trench wall direction, so as to be shadowed by the top of far wall CV1, and to deposit on the trench bottom beyond point CV8 and on the exposed side of the near trench wall (not shown), etc. This creates conductive link CV7 which overlies a next contact point in the progression along trench bottom CV2, which in this case is also to be linked with a second bypassing or "C" linkage.

The preceding repetitive loop steps are then repeated again, but with the directional deposition coming down and toward the far wall again, so as to be shadowed by the top of the near wall (not shown), and so as to deposit on the trench bottom beyond point CV10 and on the exposed side of the far trench wall CV1, etc. This creates conductive link CV9 which overlies a next contact point in the progression along trench bottom CV2, which in this case is the other end of a first bypassing or "C" linkage.

The preceding repetitive loop steps are then repeated again, but with the directional deposition coming down and from the opposing side direction, so as to be shadowed by the top of the far wall CV1, and to deposit on the trench bottom beyond point CV12 and on the exposed side of the near trench wall (not shown), etc. This creates conductive link CV11 which overlies a next contact point in the progression along trench bottom CV2, which in this case is also to be linked with a second bypassing or "C" linkage.

The preceding four loop repetitions thus complete two interleaved bypassing or "C" linkages consisting of the conductive regions CV5 and CV9 connected to the conductive region CV4 on the back wall of the trench, the other such linkage consisting of the regions CV7 and CV11 connected to the counterpart regions to region CV4 on the (not shown) front wall) of the trench. These linkages serve an analogous purpose to the cross-over or "X" type linkages described elsewhere herein in other "folded-over" pillar examples.

Truncation of the left and right ends of the now completed structure of FIG. 30 can now be accomplished by using such means as a protective mask overlying the shown region of FIG. 30. Gaps in this masking exist on the tops of the regions to the left and right of the ends of this shown region of FIG. 30. Vertical directional etching away of the regions to the left and right of the protective mask by such means as RIE or ion milling then removes the structural regions below these exposed (mask gap) regions to the depth desired. The resulting trenches thereby created then truncate the left and right ends of the region shown for the structure of FIG. 30. These trenches may be closed out with an insulator such as silicon dioxide or silicon nitride, followed by removal of the top (planar) deposition portions of this coating where desired. Or, they may be filled with a flow on material such as hardened liquid polymer or spin-on-glass, for example.

A and B trench corresponding hole contacts on pillars which lie beside one another in the axis orthogonal to the axis of pillar pair extension can be connected so as to configure these pillars as side-by-side pairs, rather than as end-to-end pairs such as those previously discussed which extend in the aforementioned axis of pillar pair extension. In this side-by-side case, the A trench corresponding holes and B trench corresponding holes will lie beside one another in the bit line extension axis. Conventional lithography can be used to form cross-over or "X" connections to link such side-by-side pillars together, thereby pairing them in what is in this case the bit line axis, rather than in the aforementioned axis of pillar pair extension. Alternatively, sub-lithographic techniques, such as the cross-over ("X") interconnection methods described elsewhere herein, can be used to make such an interconnection if the portion of the pillar (or intervening regions between pillars) in the vicinity of such a connection has been appropriately extended and insulated in accordance with the nature of the cross-over connection method selected using conventional or sub-lithographic patterning techniques, for example.

In the foregoing pillar structures with internal vertical holes, it should be noted that adding extra height to the top pillar layer can facilitate fabrication of selective plugs in the pillar tops. Such plugs can be formed by closed out depositions of different selectable materials, thereby allowing processing of a desired vertical trench etched hole, but while not processing one or more other vertical trench etched holes, where such processing is accomplished by selectively etching away a particular material capping a particular vertical trench etched hole. The various selectable materials described near the beginning of this specification can be used in this manner, for example. Also, such other materials as aluminum oxide or diamond like carbon may be used for this purpose. Where selective ion milling is used to remove a cap, use of sub-diamond carbon depositions deposited by conventional means can provide a useful low etch rate selectivity difference.

Vertical holes which are trench etched down in pillar tops can be laid out in other patterns besides the ones previously described, in accordance with engineering preference.

It is also useful to fabricate "folded-over" pillar types (as in the preceding discussion) with two-transistor-high pillars, rather than three-transistor-high pillars. In this case pull-up resistors may be spliced down to desired conventional circuit junction locations using additional holes and the splice techniques described elsewhere herein. Alternatively, such splice connections can be made using concentric splices, where the outer concentric splice conductors contact lower conductive depositions above the planar surface, and the middle splice conductors contact progressively higher conductive depositions above the planar surface. Such conductive depositions would of course be spaced apart with insulative depositions. Conventional or sub-lithographic patterning methods can be used to make progressively smaller holes in the progressively higher insulative layers, so that only the smaller cross-section concentric conductors are progressively contacted by progressively smaller concentric stacked vias.

GATES: The circuit of the pillar structure of FIGS. 6, 7 and 8 can be modified to form various other circuit types by changing the vertical wiring, C trench wiring, and any other desired variations in the transistor sequence. An example of such a modification would be any of various logic circuits, such as the following NOR gate structural variation.

The pillar structure of FIGS. 6, 7 and 8 may be shortened to comprise just layers 6P through 13N. The vertical wiring of the A trench may then be modified using the various vertical wiring and splice techniques discussed elsewhere, so as to place gate structures next to layers 7N and 12P, and then to link these gates together with a splice or similar vertical wiring connection. B trench wiring may be modified in a similar manner, so as to place gate structures next to layers 7N and 10P, and then linking these gates together in the same manner as the linkage connecting the gates just described in the A trench. In this example, the lowest layer 6P would be part of the substrate which would be grounded, and the highest layer 13N would be connected to B+, either through C trench wiring which would exist on one side of the pillar only (by lithographically or sub-lithographically masking so as to make only every other C trench unmasked for processing, for example), or through lithographically connected wiring at the top surface. If wiring in the A and B trenches is processed as in the steps leading to FIGS. 6, 7 and 8 so as to etch it back from the sides, thereby leaving it not abutting or shorting to the trenches (such as the C trench) on either side of the pillar, then bus wiring can be placed in the C trench (C1) on one side, and a C-like trench (C2) on the opposite side may be used for an additional splice or vertical wiring link. If this approach is used, then both of these trenches (C1 and C2) may be filled with a removable filler structure, thereby allowing processing of the A and B trenches as separate vertical trench etched holes. These holes may be selected for processing by capping and uncapping, or by opening an closing the tops of these holes by lithography or by alternative sub-lithographic techniques. Likewise, the trenches C1 and C2 may be opened and closed for processing by masking, such as lithographic or sub-lithographic masking, so as to make them selectably available for processing as well. When the C2 trench wiring link is desired, it would be wired so as to ohmically contact both layers 8P and 9N, and then connect them to the top surface for additional connection by lithography or other means to provide a gate output connection. Splices or other vertical wiring links to the A and B trench vertical wiring, respectively, provide NOR gate input connections to the top surface, which in turn may be contacted by lithographic or sub-lithographic means, for example.

Alternatively, the above NOR gate can be fabricated using the variation on the structure of FIGS. 6, 7 and 8 described elsewhere herein, where the vertical wiring for the A and B trenches is constructed inside two separate vertical trench etched holes etched into a pillar. In this case a third vertical trench etched hole can be used for the vertical wiring described above for trench C2. For such a pillar structure with three vertical wiring holes, C trench bus wiring can be formed around the perimeter of the pillar, or this perimeter region can be filled with insulator and the B+ contact made to layer 13N at the top by lithographic (or sub-lithographic) means. The vertical wiring in such three vertical trench etched holes in the middle of the pillar can be contacted at the top by lithographic means or other means described elsewhere herein. Other gate types, as described below for example, can also be constructed by this alternative holes-within-a-pillar approach, as well.

If the dopings of layers 6P through 13N are changed to the opposite types (i.e. the layers then become 6N through 13P, and if the B+ and ground contacts are reversed (or if the structure is layered out in an inverted configuration), then the NOR gate structure described above can serve a NAND gate function. Alternatively, both NAND and NOR gates can be fabricated near one another on the same wafer or die by adding an extra layer at the top (or alternatively an extra bottom layer version can also be configured), where this extra layer is of the opposite dopant type of the layer below it. In such a case, wiring for the NOR gates can be on the lower group of layers as before, but with a splice or other wiring structure to connect to B+ at layer 13N. Wiring for NAND gates can be offset one layer up, so as to create the equivalent NAND gate wiring pattern as described above, but with an appropriate splice linking to layer 7N for its power connection, for example. As an alternative approach, separate layer groups or sub-groups can be dedicated to different logic structures, where desired according to engineering preference.

MEMORY PERIPHERY COMPONENTS, LINE DRIVERS: If pillars at the periphery of a cell array are initially masked so that their planar cross-sectional aspect ratio is increased in the axis extending away from the array, then transistors on such pillars will be able to conduct significantly increased power. When it is desired to fabricate line drive transistors at a fine or sub-lithographic pitch which corresponds to and aligns with the pitch of the pillars in a fine or sub-lithographically pitched cell array, transistors (particularly the upper transistors) of such aspect ratio increased pillars may be used for this purpose. Once gates are fabricated on such pillars by the same techniques where FET gates are fabricated elsewhere in this disclosure, then splice and other mentioned vertical wiring techniques can be used to link to such FET gate layers on one narrow face end of the laterally extended pillar, and to link to a lower source/drain layer at the other narrow face end of the laterally extended pillar, while the mid-region of the exposed top of the laterally extended pillar is exposed for a third electrical contact. If a top layer of insulator is used to extend such splice end contacts upward, then this top layer can be masked and etched away in the mid-region of the top of the extended pillar so as to expose the conductive source/drain material beneath it. Once these three contact regions have been created at each end and in the middle of the top of the extended pillar, then parallel planar lithographic lines running orthogonal to the extension axis of the pillar can extend across many successive extended pillars, so as to contact gates, sources and drains of all the extended pillars in a side-by-side group. Where the trench regions between the adjacent laterally extended pillars' faces are filled with planarized insulator, then this sequence of contacts can successfully link a large group of laterally extended pillars which are above the lithographic limit in the lateral extension axis, but below the lithographic limit in the non-extended (narrower) lateral extension axis. Any in line (over and under) single axis wiring which extends in the pillar lateral extension axis can be severed along its length in the orthogonal axis by any sub-lithographic masking and etching techniques used to fabricate the pillars. When FET gates are formed only on the wide side or sides of the pillar using the side (horizontal) etch-back techniques which led to the wiring structures of FIG. 8, then the prior C trench type wiring or splice techniques may be used on one of the remaining narrow faces, and extended to or repeated on subsequent adjacent narrow faces, so as to provide electrical contact for sub-channel bulk regions in such FETs. Such driver pillar structures can be fabricated, above the lithographic limit in at least one axis for example, at varying pillar widths, and then linked (with splice techniques described elsewhere herein for example) so as to amplify one another, in cascade relationships to each other.

Using the pillar internal vertical trench etched hole configuration described for the internal vertical hole pillar variation described elsewhere herein, laterally extended holes inside laterally extended pillars can be used for an analogous surface area increasing—and hence power increasing—effect. Additional supplemental vertical holes added within such a pillar structure can be used for splice contacts to lower layers where desired, in a similar manner to other internal vertical hole pillar structure bit and word line splice contact examples described elsewhere herein.

MEMORY PERIPHERY COMPONENTS, SENSE AMPLIFIERS: It will be noted that the circuit structural layout described in FIG. 2 and embodied in the FIGS. 6, 7 and 8 group contains most of the elements of a signal sense amplifier. If the CMOS latch sub-structure in the middle of the greater structure is appropriately precharged in a conventional manner, then enabling the upper and lower access transistors can cause the latch portion of the circuit to assume the state of charge of the first signal to which it is exposed, in the conventional manner of a conventional bi-stable signal sense amplifier for a semiconductor memory. If no other cells on a bit line are selected, then application of appropriate pre-charge signals to the bit lines (from structures such as the line driver structures described above) can pre-charge such a latch structure, where its access transistors can connect it to such a pre-charged bit line when desired. Subsequent selection of a cell on the bit line can cause it to place its signal on the bit line so as to cause this sense amplifier latch structure to assume the state of the selected cell, according to the polarity of the signal from the cell. Pillars for such latch structures may be laterally (planar axes) lengthened or narrowed for electrical effect according to engineering preference.

MEMORY PERIPHERY COMPONENTS, LINE SELECTION DECODING: In some cases rows and columns of pillar cells will have lateral (planar axes) dimensions greater than or equal to half the available minimum feature size (lithographic groundrule associated resolution limit). Often lithographic location precision (registration) is considerably better than this resolution groundrule. In such cases, adjacent rows or columns patterned at the lithographic limit will typically be spaced apart at twice the pillar width, due to the need to pattern intervening trenches between pillars. In such cases, lithographic lines which are at the lithographic limit may be placed over a row or column of cells where the pillars and trenches are each sized greater than or equal to half the lithographic limit. In such cases, where these lithographic lines are centered over a row or column of pillars, then each such line will overlap half a trench width to either side of the row or column of pillars. Because of this, patterning at the lithographic limit can be used in such a case to resolve selection of a desired row or column. Therefore, in such a case, masking for selection of underlying contact points for decoder line coding and selection can be accomplished with available lithography. Row or column pillars and trenches may be somewhat less in width than half the lithographic resolution limit. In such cases, sidewall deposition masks (as with the ribbon group masking structures described elsewhere herein) can be used to achieve finer effective resolution for creating image type masking for line encoding and selection of lines and traces or features, where such sidewall depositions are on otherwise sufficiently accurately registered lithographic mask lines which have vertical sidewalls.

VERTICAL WIRING SPLICE AND "U" BASED ALTERNATIVE INTERCONNECTS: Linkages can be configured to electrically connect regions at one height on a trench wall to other regions farther away, such as regions at similar or different heights across a trench.

SHORTENING TRANSISTOR FEATURES: Masks made from sub-lithographic side depositions (such as the aforementioned ribbon masks) may be used to define features in the planar axes where these features are below the lithographic limit. This allows defining gate lengths which are unusually short (in a first axis) or unusually narrow (in a second orthogonal axis), or defining sides or ends of sources and drains which can make these structures unusually short as well. One technique for accomplishing this is to use selected spacings in a ribbon mask (with the ribbon thicknesses selected according to engineering preference for the size of the underlying structure), where these open spacings define trenches to be etched below. These trenches then limit the extremities of the dimensions (the widths or lengths) of the features which underlie the masking ribbon, while using the masking ribbon to protect the underlying structure. Trenches (which can be filled later with insulator) are then etched between the protective mask ribbons, where these trenches are located so as to cut off the ends of the underlying structure at the selected points. In this manner, a source and/or drain can be shortened (at the ends of the transistor, in the length axis) below the previously available feature definition size, or portions of a transistor can be cut off in an orthogonal (width) axis so as to narrow it below the previously available feature dimension. These techniques allow reducing gate length with respect to width so as to reduce channel resistance, or reducing source and drain footprint dimensions so as to reduce source and drain diode surface area in a well, for example.

Shortened Planar Transistor Sources. Gates and Drains:

TRANSISTOR PLANAR LAYOUT: When transistors are fabricated with the above technique, they can be arranged in convenient repetitive patterns which allow more convenient contact to subsequently added planar wiring structures. For example, 6-transistor SRAM cells (as in FIG. 1) may be conveniently laid out with the four latch transistors in a close-packed 2.times.2 arrangement (i.e. two side-by-side above two more side-by side) with all transistors extending source-gate-drain in a first (nominally vertical) orthogonal axis (sources can be exchanged for drains if desired). This layout may be combined with axis transistors extending out to the sides in a second (nominally horizontal) orthogonal axis, where these axis transistors may extend out and away from the nominally vertical (planar axis) midpoint of the first 2.times.2 transistor arrangement in accordance with engineering preference. Such an arrangement permits wider bit lines to then be patterned, where these bit lines run nominally vertically (planar axis) while contacting the axis transistors at the nominally left and right extremities of each cell layout. Nominally horizontal word lines can also be patterned to extend nominally horizontally above the middle of the cell layout. Selection of other layout patterns for these or other structural layout and wiring configurations can then be made for variations on this theme, or for other circuit types, in a similar manner, as desired according to engineering preference.

FOLDED PILLAR TRANSISTOR: Vertical pillar transistor N-P-N or P-N-P structural sequences can also be folded into "U" shaped structures.

Artificial SOI:

3-D SOI TRANSISTOR STRUCTURES: As in the "Improved Substrate Isolation" example discussed elsewhere herein, pillar transistors can be isolated from one another by vertical repetition of the cut-away and insulator-fill isolation process discussed elsewhere, or in a variation as follows. The intervening gap region between two pillars should first be filled with a selectable material, for example a hardened liquid polymer. As another alternative, the intervening trench walls (and typically the trench bottom) may be coated with some other more durable selectable material, such as silicon dioxide or silicon nitride as in the prior C trench examples, and then filled with hardened liquid polymer or Parylene or some other material with a high etch selectivity. When the surface above these pillars and gap fills is masked, and the wafer processed, so as to etch or open trenches (by any selected conventional means) on the exposed sides of the pillars which are not abutting the intervening gap region fill material, then the sides of the pillars in these open trenches are exposed and available for masking by the aforementioned sidewall masking techniques. The vertically extending gaps in such sidewall masks can then be used to etch gaps or cut-aways into the side of the pillar. When such an etch continues all the way through the pillar, certain alternately doped regions may be isolated from other alternately doped regions. In this manner, alternately doped groups forming source, channel region and drain, emitter-base-collector, or other semiconductor doping structure sequences can be fully electrically isolated from one another in the manner associated conventionally with SOI (silicon-on-insulator). Among the other benefits of SOI structures possessed by these now isolated doping structure sequences, when these doping structure sequences form the sources, channel regions and drains of CMOS transistors, then latch-up conditions are inherently eliminated between such CMOS transistor doping structure sequences. This type of processing can be done multiple times, at multiple heights, for multiple transistors or groups of transistors.

Shortening Planar Transistor Sources, Gates and Drains:

SOURCES AND DRAINS WITH REDUCED CAPACITANCE: to reduce the junction contact area between sources and/or drains and the alternately doped bulk region which incorporates the channel region in an FET, by cutting partially through the horizontal junctions separating source or drain from the bulk region, or the next adjacent source-drain.

HEAT REMOVAL: Cooling for transistor circuit structures can be enhanced by depositing thermally conductive material or Peltier cooling. <Par. 1543> <through Par. 1547>

LIQUID PISTONS: Where pistons are set to prescribed heights, materials which can be deposited as flowed-on liquids may also be used, and may be sufficiently more convenient to use so as to be preferred by the fabricator. An example of such a suitable liquid piston material would be the conventional "SU-8" material used commonly for photolithographic masking in micromachining applications, but in this case preferably without the photosensitizer included in it for simplification of the fabrication process. Thinning this material enhances its ability to more quickly penetrate small trench holes in the structures described herein. Extreme or "ultra" thinning is preferred where the trench structures are very small. This material levels well and typically eliminates any of its own bubbles during baking. Solvents of low volatility are preferred, such as gamma butyrolactone (commonly called "GBL") or N methyl pyrollodine (commonly called "NMP"). Such a flow-on piston material is preferably used by: (1) conventional resist flow-on type of application, (2) conventional baking, and (3) selective omni-directional etching sufficiently to etch the resulting piston structures down to their intended heights. Later removal of the pistons is by use of conventional selective etchants for removing such photoresists. Such a hardened (baked) liquid polymer material may be used in applications called out herein where pistons are defining masking or other height related operations, where other top-to-bottom fills with Parylene are called out, or where liquid fill operations are otherwise called out.

Shortening Planar Transistor Sources, Gates and Drains:

SUB-LITHOGRAPHIC MASKING: Several techniques are described herein which allow fabrication of gate structures below the lithographic limit. Such structures can facilitate fabrication of gates which are shorter, and hence wider in aspect ratio, than otherwise possible by conventional lithographic methods. Such short (and hence "wide") planar gates can be patterned with a masking line whose width defines the short axis of the gate, where such a masking line is formed in the manner of the ribbon group mask structures described elsewhere herein. In such cases, the thickness of the mask line portion of the ribbon groups is selected to match the underlying gate structure to be patterned. Such thicknesses of mask lines in ribbon groups can be selected so as to overlie ends of sources and drains or other transistor structures in a second orthogonal axis so as to shorten or narrow them below the lithographic limit. Such sublithographic planar structures can also be defined by depositions which are deposited at an angle on one side only of conventional planar lithographic mask lines. Such depositions are created by angular depositions (by columnar or long throw sputtering, for example) directed (at 45 degrees, for example) so as to coat one side of a selectably removable vertically sided masking line (made of photoresist, for example), but so as to shadow the other side of the removable masking line, followed by vertically etching away the exposed top and bottom horizontal surfaces of the deposition, before selectively etching away the removable masking line.

Selective Ion Milling:

FLOATING GATE STRUCTURAL VARIATIONS: For applications such as flash memory, floating gate field effect transistor structural variations can be constructed by modifying the side wall gate FET structures disclosed herein. When a polysilicon vertical side wall gate layer is patterned by means described elsewhere herein, this layer may be deposited thick enough to allow for further thermal oxidation on the exposed side of the layer. This thermal oxidation (and also the initial thermal oxidation below the polysilicon layer) is performed so as to create insulative layers of appropriate thickness above and below said polysilicon layer. This is done so as to permit said polysilicon layer to serve as a floating gate, once the top, bottom and sides of each such floating gate layer has been patterned by the gate layer vertical and side patterning techniques described elsewhere herein. The shape of such floating gate layer can be the same as the shape of the control gate structure to be formed above it, or it can be of an alternative shape according to engineering preference, where, for example, a variety of conventional floating gate to control gate layout relationships are used in different flash memory applications. (Alternatively, an omni-directional deposition of a selectable insulator such as silicon dioxide can be used instead of the thermal creation of the oxide insulation layer.)

Alternatively, another type of conductive gate layer deposition such as tungsten can be deposited instead of the aforementioned polysilicon layer. In such a case, other methods of insulator deposition such as CVD or ALD can be used to create gate insulation layers instead of thermal oxide, where desired according to engineering preference. Patterning of such an alternative layer is by conventional selective etching means equivalent to means used to pattern the polysilicon.

Such a floating gate structure is completed by the aforementioned control gate layer structure being fabricated above it by similar fabrication means. This control gate may be fabricated from polysilicon, or from an alternative conductive material such as tungsten (as described above). The shape of such a control gate can be the shape of a gate layer described for a transistor elsewhere herein, or the shape may be chosen in accordance with engineering preference where, for example, a variety of conventional floating gate to control gate layout relationships are used in different flash memory applications, as previously indicated.

LIGHT PIPES:

SELECTIVE TUNGSTEN SIDE WALL WIRING: <Par. 1556>

VERY FINE WIRES: A very thin layer of conductive material (doped polysilicon or tungsten for example) is deposited on a planar surface of insulator (silicon dioxide for example). Or alternatively, a very thin layer of doped crystalline silicon may be grown over a planar insulator surface such as sapphire or ion impregnated silicon dioxide (SIMOX). Ribbon group masks are then formed (as described elsewhere herein) above such conductive material from selectable material pairs such as Parylene and silicon dioxide, for example. The ribbon group masks comprise alternating very thin layers of the chosen selectable materials. One of the selectable materials in the ribbon group masks is then selectively etched away, leaving the other ribbon group mask material layers standing. These standing ribbon group layers serve as a mask which is then used to vertically etch the very thin layer of conductive material below this mask. This leaves a pattern of very thin parallel conductive wiring traces extending horizontally below the aforementioned mask, after which the mask may be selectively etched away. Ribbon group material may be deposited by such means as CVD, or atomic layer deposition (ALD) techniques to achieve extremely thin layers.

MAGNETIC AND PILLAR MASKING APPLICATIONS: A very thin layer of magnetic material, such as a conventional iron oxide layer of the type used on magnetic disk surfaces, is deposited on a planar surface. Conventional alloys of iron and platinum or cobalt and samarium are examples of alternative magnetic disk materials for deposition on said planar surface. Such magnetic material may be selected for magneto-resistive, giant magneto-resistive, spin valve, or other memory storage enhancing characteristics, but in any event is a medium which relies on changes of magnetic state as a factor in such memory storage. Such states in small local regions are accessed and written or read by a sensor, where said sensor may be scanned over the surface by conventional means, so as to access a plurality of such regions on the surface.

A first patterning option is as follows: Ribbon groups are then fabricated on top of this surface of magnetic material, where the strips of such ribbon groups extend in parallel straight lines which extend in a single axis. When the intervening ribbon group material is etched away so as to leave a ribbon group mask composed of the remaining ribbon group material, then the ribbon group can serve as a mask made up of strips which extend in a first axis. Vertical etching of the exposed planar surface by such means as ion milling or RIE then transfers the pattern of this ribbon group mask down to said magnetic material layer on said planar surface, The ribbon group mask is then removed by such means as selective etching or chemical-mechanical polishing, leaving said lower magnetic material layer patterned according to the pattern of said ribbon group. The magnetic material layer may be partially etched, or etched through entirely. This leaves strips of said magnetic material which form lines. When the strips of these ribbon groups are of sub-lithographic width, then these lines of magnetic material are also of sub-lithographic width. Small regions of these lines may then be written to or read from by said sensor.

This first patterning option can also be used to form a mask over a material which need not be magnetic. Such a material (aluminum oxide, silicon nitride, silicon dioxide, FOP or Parylene, for example) can be used as a mask below which silicon wall structures can be created by trench etching.

A second patterning option is as follows: A second upper layer of ribbon groups may be fabricated on top of the aforementioned (hence first or lower layer) ribbon groups, where said second (upper) layer ribbon groups extend in an axis orthogonal to said first (lower) layer ribbon groups. When the intervening ribbon group material is etched away so as to leave a ribbon group mask composed of the remaining ribbon group material, then the combined orthogonally extending ribbon groups can serve as a mask made up of strips which extend in orthogonal axes. Vertical etching of the exposed planar surface by such means as ion milling or RIE then transfers the combined pattern of this ribbon group masking down to said magnetic material layer on said planar surface. The ribbon group masking is then removed by such means as selective etching or chemical-mechanical polishing, leaving said lower magnetic material layer patterned according to the pattern of said combined ribbon group masking. The magnetic material layer may be partially etched, or etched through entirely. This leaves small square or rectangular regions of said magnetic material which form an array or matrix of such small regions. When the strips of one or both ribbon groups are of sub-lithographic width, then these small regions of magnetic material are also of sub-lithographic width in one or both axes. These small local regions may then be written to or read from by said sensor.

This second patterning option can also be used to form a mask over a material which need not be magnetic. Such a material (aluminum oxide, silicon nitride, silicon dioxide, FOP or Parylene, for example) can be used as a mask below which silicon pillar structures can be created by trench etching.

A third patterning option is as follows: The ribbon groups of the first patterning option can be fabricated in a disk shaped pattern of concentric planar rings, rather than extending in a single planar axis (in straight lines). In this patterning option, concentric planar rings are created by lithography, and then the ribbon groups are fabricated on the sides of these rings. By using the same step sequence as in the first patterning option which created ribbon groups on the sides of lithographic single axis extending lines, in this third patterning option these ribbon groups are thus formed in the pattern of concentric rings. By continuing the steps of the first patterning option for this new concentric ring pattern, this leaves strips of said magnetic material patterned in concentric rings. When the strips of the ribbon groups are of sub-lithographic width, then these strips of magnetic material are also of sub-lithographic width. Small local regions along these strips may then be written to or read from by said sensor, where said sensor can remain temporarily stationary over a given ring, and the planar surface can be rotated below the sensor around the center point of the concentric rings.

A fourth patterning option is as follows: A second layer of ribbon groups may be fabricated on top of the aforementioned (hence first or lower layer) ribbon groups described for the third patterning option. The ribbon groups of this second layer extend radially outward from the center point of the lower layer's concentric rings, although they preferably are not continuous from said center point to the outer periphery of the overall pattern. Preferably, such radial lines are themselves grouped in a plurality of concentric rings. The outer such upper layer concentric ring preferably contains many more radial lines than the inner such concentric ring. In this patterning option, concentric rings of radial traces are first created by lithography, and then the ribbon groups are fabricated on the sides of these radial traces. By using the same step sequence as in the second patterning option which created ribbon groups on the sides of lithographic single axis extending lines, in this fourth patterning option these ribbon groups are thus formed in the pattern of concentric rings of radial traces. By continuing the steps of the first patterning option for this new pattern of rings of radial traces, this leaves said magnetic material patterned in concentric rings of radially interrupted traces. When the strips of the ribbon groups are of sub-lithographic width in one or both axes, then these radially interrupted concentric rings of magnetic material are also of sub-lithographic width in one or both axes. Small local regions along these radially interrupted concentric rings may then be written to or read from by said sensor, where said sensor can remain temporarily stationary over a given ring, and the planar surface can be rotated below the sensor around the center point of the concentric rings. Lithographic patterning and etching may used to etch thin concentric rings which remove the aforementioned pattern where ribbon groups loop around between ends of radial lines pairs, if it desired to remove these regions. When the small local regions are sufficiently small so as to be the size of one such concentric ring between two adjacent radial divisions, particularly where the aforementioned ribbon structures are fabricated significantly below the contemporary lithographic limit, then these small local regions of magnetic material can benefit from reduced susceptibility to superparamagnetic effect.

Other pattern variations besides the aforementioned straight lines, concentric rings, and their orthogonal and sectoring supplemented cross-patterns can be fabricated as well. However, these are the preferred patterns.

Ribbon groups for these magnetic layer structures, as well as for other applications, may be formed by atomic layer deposition techniques and materials to create thinner layers. Likewise, thin thermal oxidations of silicon depositions can be used to create thinner side wall vertical layers, although such side wall layers are preferably not closed out, but instead closed out with a material other than thermal oxide. For example, after the tops and bottoms of a thermal oxide layer have been etched away in the step sequence creating a ribbon group, the region between opposed thermal oxide side wall layers can then be closed out with a fill of flow-on polymer (FOP). Alternatively, a further omni-directional deposition of a non-thermal oxide selectable material such as silicon or Parylene may used, for example, or other deposited materials may be used according to engineering preference.

Stencil-type masking structure and method: As an alternative fabrication option, a layer of selectively etchable material such as silicon may be coated with a thin layer of further selectively etchable material such as Parylene. (A thin layer FOP is another option, for example.) Patterning means such as discussed in the aforementioned four patterning options can then be fabricated on top of this Parylene. In this case the patterning structure (patterning means) should include interspersed wider structures additional to the patterning option features previously described, these wider structures being defined by the original masking on the sides of which the ribbon groups were created. For example, the orthogonal patterns previously described for the first and second patterning options can include additional wider solid lithographically defined traces at regular intervals in each orthogonal axis. Or, the circular patterns described for the third and fourth patterning means can include additional wider solid lithographically defined concentric ring traces at regular intervals, these rings being centered on the common center point for the previously described concentric rings. Associated with these rings, additional wide radial traces can extend out from the center point, as well. These wider structures can be thickened by protectively masking the thinner ribbon group structures with photoresist, then depositing additional material over said wider structures exposed in gaps photolithographically created in this masking, then lithographically patterning this additional thicker material so as to vertically thicken these wider structural regions. These wider structures can enhance structural support.

Once such a patterning structure has been created, then the underlying Parylene (in this example) layer will be exposed on the top through the gaps in the top ribbon group patterning. The patterning structure is preferably connected by such means as common deposition material to a secondary mechanical means of support, such as a surrounding mechanical ring which is resting on the lower surface below the Parylene. The Parylene is then exposed to a selective, preferably gaseous, omni-directional etchant such as isotropic oxygen RIE. This Parylene then etches away first under the thinner patterning, before it subsequently etches further under the wider patterned structural support regions. This then allows the Parylene to be etched away entirely where it is under the general vicinity of the thinner patterning, but only to be etched in a little from the sides into the regions under the wider structural support patterning. A selective, preferably gaseous, omni-directional conventional etchant selective for silicon then etches away the exposed tops and sides of the silicon below the Parylene. This frees the upper patterning structure from the lower surfaces, but with the Parylene still coating the bottom of this patterning structure to serve as a standoff layer. This creates a stencil-type planar masking structure comprising the earlier mentioned thinner patterning which is spaced above any lower surface by the thickness of the Parylene standoff layer.

This stencil-type masking structure is then positioned by suitable mechanical means over a surface to be patterned, such as a silicon dioxide coated silicon wafer, or a magnetic surface layer as previously described. If the stencil-type masking structure is constructed from silicon dioxide, then when a vertical directional deposition of a suitable selectable material such as silicon is deposited down toward the masking structure, then this deposition will coat primarily the tops of the masking structure and the regions below the mask openings in the pattern previously described for the selected one of the four patterning options. This deposition should be of a thickness less than the thickness of the Parylene standoff layer. The stencil-type masking structure can then be mechanically removed from the surface being coated, and subsequently cleaned with a conventional selective etch to remove the unwanted silicon deposition remaining on it. This leaves islands of silicon on top of the lower layer which can subsequently serve as a vertical etch (such as RIE or ion milling) mask of the lower layer material. Patterning the lower material in this manner creates a similar effect to one of the aforementioned four patterning options. The silicon islands may either be eroded away in the process of the vertical etch, or may be subsequently removed by a conventional selective etchant. The stencil-type masking structure may then be reused.

The pattern produced by such a stencil-type mask can be converted to a negative image, as follows:. The islands produced below such a mask (silicon islands in this case) can be covered with a hardenable liquid coating such as FOP or spin-on glass (SOG), where this coating is then etched down to a height which exposes the tops of the islands. The islands are then selectively etched away leaving the surrounding material which has holes now where the islands originally were. This new coating now takes the form of a negative image of the original mask image.

A stencil-type structure of this type can also be used as a filter, for example, to filter photoresist used in the fabrication of integrated circuit structures such as those mentioned herein. Dimensions of holes in such a filter can be determined by control of the relative thicknesses of open interstices between walls of the stacked ribbon groups. The pattern of such a structure can alternatively be transferred down to a lower layer of material, where such structure is initially used as a stencil-type mask as previously described. This pattern image may be made negative as previously described, as desired. The deposition or other coating thus patterned can be used to as a mask, or to etch holes in a lower layer to be used as a mask, where such lower layer may be formed over an etch selectable layer beneath it, such as a Parylene layer. Such lower Parylene can be etched away in the manner previously described, thereby releasing the patterned layer above for use for a desired purpose, such as a filter.

POWER TRANSISTOR VARIATION: <Par. 1573> <through Par. 1574>

CMOS VERTICALLY-STACKED PILLAR TRANSISTORS: <Par. 1576> <through Par. 1577>

Wiring in Holes within Pillars:

SUB-LITHOGRAPHIC CONTROL OF ACCESS TO SELECTABLE HOLES: Pillar structures containing one or more vertically wired internal holes are described elsewhere herein. The cross-section of such a pillar can be disproportionately extended in one planar axis. More than one such hole can be located in one (or more) line(s), where such line(s) of holes extend along this pillar axis of extension. Before creation of the subsequently described wall and before vertically wiring, these holes are filled with a selectable hardenable liquid such as a flow-on polymer (FOP), such as photoresist or a similar material. This FOP is planarized even with the hole tops.

A vertical wall of a highly selectable material such as aluminum oxide is fabricated next to the top of such a line of holes, such that the bottom of this wall is approximately at the height of the tops of one or more pillars. This wall extends in a planar axis orthogonal to the aforementioned axis of extension of pillars and holes. This wall can be fabricated by lithography, or by coating the side wall of a lithographic trace with aluminum oxide by such deposition means as directional sputtering directed at an angle down and toward the side of the trace wall. Any remaining aluminum oxide coating the exposed horizontal surfaces is then vertically etched away. Etching of the aluminum oxide can be by such vertical etch means as ion milling.

The exposed FOP in the holes is etched down to a first height, which will typically be shallow with respect to the overall depth of the holes. The now empty tops of these holes are then filled with a vertical directional deposition of an etch selectable material, silicon dioxide in this case, deposited by such means as long throw or collimator sputtering. The vertically measured thickness of this deposition is such that the material in the hole tops is even with the tops of the holes.

Supplemental aluminum oxide side wall deposition step: An omni-directional deposition of a selectable material such as additional aluminum oxide is deposited (by ALE or other conventional means), and the exposed tops and bottoms of this deposition are vertically etched away, so as to leave a supplemental vertical wall of aluminum oxide on the side of the aluminum oxide wall. The position of the original aluminum oxide wall and the thickness of this additional aluminum oxide deposition are chosen such that the bottom of this resulting supplemental aluminum oxide wall coating covers the top of the first hole to the side of the aluminum oxide wall.

Silicon dioxide hole top cap step: The silicon dioxide now exposed to the side of this supplemental aluminum oxide vertical wall coating is then selectively etched away from the tops of the pillars and from within the tops of the exposed holes. The now exposed FOP in the remaining holes is then selectively etched down a little more. The now empty tops of these holes are then filled with a vertical directional deposition of an etch selectable material, silicon dioxide in this case, deposited by such means as long throw or collimator sputtering. The vertically measured thickness of this deposition is such that the material in the hole tops is even with the tops of the holes.

The prior supplemental aluminum oxide side wall deposition step, and subsequent silicon dioxide hole top cap step, can then be sequentially repeated until each successive hole is capped with a successively deeper silicon dioxide top cap.

The original aluminum oxide wall, supplemental aluminum oxide side wall coatings, and accumulated silicon dioxide residual top coatings beneath the supplemental aluminum oxide are then removed. Removal may be by coating with a hardenable liquid such as FOP, planarizing this liquid by such means as CMP, followed by ion milling the top structures down to the height of the pillar tops. Alternatively, the top structures may be planarized by polishing with chemical supplement where desired. (Either of these planarization techniques may typically be used wherever planarization or CMP for this purpose is required elsewhere herein.)

Subsequent selective etching of the top cap material (silicon dioxide here) first exposes the lower fill in the hole with the shallowest top cap. This exposed hole is then processed, to create vertical wiring for example. Hole processing is completed by filling the hole with a selectable material such as FOP which has been planarized and etched down to the height of the top of the hole. This FOP is then etched down to a height which is lower than the depth of any of the prior silicon dioxide top caps. Each such exposed hole is then top capped in the manner of the aforementioned silicon dioxide hole top cap step, but this time with a deeper top cap (due to the lower FOP hole fill height) than any of the original top caps formed in the earlier step sequence, this deeper top cap designating this hole as completed, followed by planarizing the top to remove the silicon dioxide above the hole as before.

Process loop: Selective etching of the top cap material (silicon dioxide here) subsequently exposes the lower fill in each pillar hole with the next shallowest top cap. This exposed hole is then processed, to create vertical wiring for example. Processing of this next hole is completed as with the prior hole, by filling the hole with a selectable material such as FOP which has been planarized and etched down to the height of the top of the hole. This FOP is then etched down to the same height as in the prior completed hole. Each such exposed hole is then top capped in the manner of the aforementioned silicon dioxide hole top cap step, but this time with a deeper top cap (due to the lower FOP hole fill height) than any of the original top caps formed in the earlier step sequence. Planarizing the top to remove the silicon dioxide above the hole is done as before.

These process loop steps can then be sequentially repeated until each successive hole is processed and capped with a deep silicon dioxide top cap. If the top surface was not planarized to remove the extra silicon dioxide after each oxide deposition step, it can then be planarized at this point by such as the previously indicated means, down to a height just below these deeper top caps, thereby exposing the vertical wiring or other structures beneath.

An alternative method is as follows: The original wall (aluminum oxide in the preceding steps) is created. Prior to the first supplemental aluminum oxide side wall coating being created, all holes whose tops are still exposed are processed together (identically) to create the internal hole structure desired for the next hole to the side of the current wall side. After this processing these holes are filled with FOP, and this FOP is planarized down to the tops of the pillars as before. Then the following process loop is performed:

Process loop: The next supplemental aluminum oxide side wall coating is added. Then the remaining holes are etched open and the internal structures selectively etched away from the side walls of the holes. These remaining holes are then processed to create the structures desired for the next hole to the side of the extended width of the aluminum oxide wall. After this processing these holes are filled with FOP, and this FOP is planarized down to the tops of the pillars as before. This process loop is then repeated until all the successive holes are processed as desired.

SELF-ALIGNED VERTICAL TRANSISTORS: As described elsewhere herein, pillar structures can be fabricated which contain one or more stacked vertical transistors. The pillar layers with different epitaxial dopings for each such transistor can be separate layers for source, bulk and drain regions. Alternatively, in the following sel-aligned example, a region which is a single uniformly epitaxially doped pillar layer can be created and used for each such complete transistor, with a doped such region (layer) of alternate dopant type for each such successively stacked complementary CMOS transistor, for example. In such a case, each such uniformly doped pillar layer can serve a function analogous to a conventional planar doped well structure, where source and drain regions of opposite dopant type to such uniformly doped region are diffused into the side of said pillar. (Such diffusion can also be performed into the sides of such regions on the sides of holes formed within pillars, where this optional structural variation is used.) Side wall doping of such a uniformly doped region by diffusion can be accomplished for applications where such uniformly doped region is exposed either on the side or sides of a rectangular pillar, on the exterior surround of a round pillar, or on the interior surround of a hole within a pillar. The following example describes such structures for diffusion doping and associated functions:

Gate structure: The side wall is thermally oxidized to a suitably thin thickness for a gate insulator, and a layer of conductor such as polysilicon (tungsten is an option) is omni-directionally deposited over this thermal oxide. A thick outer layer of silicon dioxide is then omni-directionally deposited by such means as CVD (or optionally created by thermal oxidation of the polysilicon), so as to coat the exposed outer side wall. Piston and sleeve masking (as described elsewhere herein) is used to vertically mask and etch this outer silicon dioxide layer and underlying polysilicon layer. This masking is located so that the resulting segment of these two layers then extends just above and just below the desired top and bottom ends of a first underlying gate conductor being formed (using FOP piston with silicon nitride sleeve, for example). Additional higher up gate conductors can subsequently be formed if desired An omni-directional selective etch of the exposed upper and lower ends of the thus sandwiched polysilicon layer is then performed, while the gate insulator silicon dioxide layer protects the other surfaces. A thin omni-directional deposition of silicon dioxide is then deposited so as to close-out in the newly created gap where the ends of the polysilicon layer was etched back between the inner and outer silicon dioxide layers. Silicon dioxide is then etched back by timed etch, so as to remove the non-closed out portions of this new layer, while also removing the thermal oxide gate insulation layer extension, where it is not underlying the polysilicon gate layer or the closed out regions just added. (Alternatively, the exposed ends of the polysilicon gate conductor layer can be thermally oxidized to achieve the effect of the aforementioned close-out) This leaves the thermal oxide gate insulation layer under the gate and under the etch-protected closed-out segments in the gap region where the etched back polysilicon ends had been. Also, these closed-out segments, the gate polysilicon conductor layer, and the outer silicon dioxide layer covering them remain as well. Multiple gate structures of this type (preferably increasingly higher up the stack) can be masked and otherwise patterned by piston and sleeve just after the initial gate structure polysilicon and outer silicon dioxide coatings are patterned, followed by the subsequent steps which create the closed out gap regions, etc. The following step sequences then start on the vertical region where, in the case of a vertical stack of transistors, it is desired to form the lowest transistor, and progress upward to higher transistors:

Create vertical window masking for drain and source diffusion: At this point in the fabrication sequence, a gate structure coated with silicon dioxide exists, roughly vertically centered, on the side wall of each differently doped layer where a transistor is to be formed. The silicon dioxide of these gate structures can be used as vertical diffusion masking. When this vertical diffusion masking is supplemented by additional silicon dioxide vertical masking between these gate structures, then windows (vertical gaps) between said gate structures and said supplemental silicon dioxide vertical masking can serve as diffusion mask openings. These diffusion mask openings are then used to locate diffusions from various diffusion source layer segments, where these layer segments are fabricated so as to overlie said mask openings, as follows:

A layer of silicon nitride (the "inner" layer) is omni-directionally deposited, so as to protectively coat the side wall and the gate structures along it. This silicon nitride layer is then patterned from bottom to top by such means as piston and sleeve masking (FOP piston, silicon dioxide sleeve for example), so as to leave silicon nitride layer segments over the gate structures. These layer segments are patterned so as to extend just above and just below the upper and lower ends of each gate structure on the side wall. An outer layer of silicon dioxide is then omni-directionally deposited, so as to coat the side wall and the now silicon nitride coated gate structures along it. An outer layer of silicon nitride is then omni-directionally deposited, so as to coat said silicon dioxide outer layer. This outer layer of silicon nitride is then patterned from bottom to top by such means as piston and sleeve masking (FOP piston, silicon dioxide sleeve for example). This outer silicon nitride layer is patterned so as to create protective layer (masking) segments which overlie portions of the outer silicon dioxide layer, where these outer silicon dioxide layer portions will become the aforementioned supplemental vertical masking between the gate structures, located appropriately so as to create the previously described diffusion windows. The portions of the outer silicon dioxide layer exposed by the gaps in the outer silicon nitride layer mask are then selectively etched away. The exposed outer silicon nitride layer portions remaining over the now created supplemental silicon dioxide vertical masking segments, and also the now exposed inner silicon nitride layer portions protecting the silicon dioxide coated gate structures, are then selectively etched away. This leaves the previously discussed gate structures and intervening supplemental silicon dioxide vertical masking segments on the side wall. The windows (vertical gaps) between these alternating gate structures and masking segments are thus available for use as diffusion mask openings as previously described.

Drain (or source) preparatory step sequence (i.e. the drain or source structure abutting the lower end of the gate): A layer of silicon nitride is omni-directionally deposited, so as to coat the side wall. This silicon nitride layer is then vertically patterned, repeatedly from the lowest to highest same type transistor, by such means as piston and sleeve (FOP piston, silicon dioxide sleeve for example). This patterning is such that, for each transistor being patterned, a short window extends downward below the gate structure, this window being of the height desired for each drain (or source) being formed for the current step group dopant type and amount. The upper end of said window starts a little below the lower end of said polysilicon gate conductor, and the rest of such window continues further down to create a mask opening of suitable height to diffuse the drain (or source) being formed in subsequent steps. A layer of a suitable dopant source, such as phosphosilicate glass (PSG) or borosilicate glass (BSG), is deposited so as to coat the exposed side wall. This dopant source layer is then vertically patterned from bottom to top by such means as piston and sleeve (FOP piston, silicon nitride sleeve for example). This patterning is performed so as to leave layer segments contacting the silicon side wall through the open windows (vertical gaps) in the silicon dioxide, and in the supplementary masking overlying silicon nitride layers. The silicon nitride sleeve and now exposed silicon nitride layer portions which were beneath the dopant source layer are selectively etched away.

Source (or drain) preparatory step sequence (i.e. the source or drain structure abutting the upper end of the gate): A layer of silicon nitride is omni-directionally deposited, so as to coat the side wall. This silicon nitride layer is then vertically patterned, repeatedly from the lowest to highest same type transistor, by such means as piston and sleeve (FOP piston, silicon dioxide sleeve for example). This patterning is such that, for each transistor being patterned, a short window extends upward above the gate structure, this window being of the height desired for each source (or drain) being formed for the current step group dopant type and amount. The lower end of said window starts a little above the upper end of said polysilicon gate conductor, and the rest of such window continues further upward to create a mask opening of suitable height to diffuse the source (or drain) being formed in subsequent steps. A layer of a suitable dopant source, such as phosphosilicate glass (PSG) or borosilicate glass (BSG), is deposited so as to coat the exposed side wall. This dopant source layer is then vertically patterned from bottom to top by such means as piston and sleeve (FOP piston, silicon nitride sleeve for example). This patterning is performed so as to leave layer segments contacting the silicon side wall through the open windows (vertical gaps) in the silicon dioxide, and in the supplementary masking overlying silicon nitride layers. Unless this is the last dopant source layer deposited before diffusion, then the silicon nitride sleeve and now exposed silicon nitride layer portions which were beneath the dopant source layer are selectively etched away.

The preceding drain/source and source/drain step sequences are repeatable for higher transistors up a stack. Appropriate opposite dopant types for opposite epitaxially doped bulk layers higher up such a stack are used as required.

Diffusion: At this point any high temperature sensitive material such as FOP is ensured etched away. The structure is then heated suitably so as to cause the desired diffusion of dopant, from the PSG/BSG dopant drain and source layer segments, into the portions of the pillar, through the aforementioned short windows, so as to create the desired drains and sources next to and underneath the gates. Said dopant drain and source layer segments are then selectively timed etched away, leaving one or more complete vertical transistors.

Vertical wiring: Vertical masking by such means as piston and sleeve (FOP piston, nitride sleeve for example) can then be used to open windows in the silicon dioxide coating over the gate conductor layers of successively higher transistor gates. Vertical wiring techniques can then be used to contact such now exposed gate conductor layers, as well as the now exposed drain and source regions.

ETCH TIMING:

Cross-Over ("X") Connections:

LITHOGRAPHIC CROSS-CONNECTIONS: When the sides of a pair of rectangular side-by-side pillars face the respective sides of another pair of orthogonally adjacent side-by-side pillars across an intervening trench, and when each side of each such pillar which faces the trench has an insulated vertical wiring trace extending up such side to the top of each such pillar, then when the tops of said pillars are themselves coated with insulator, the upward extending vertical wiring traces can be selectively contacted by conventional lithographic planar wiring fabricated on and above the pillar tops. A particularly useful connection of this type is a cross-connection, or "X." The first trace of such a connection connects the vertical trace on the side of a first pillar face of a pair across the filled and planarized trench, over to the vertical trace which is on the pillar face opposite the pillar paired with the first pillar. A second trace, above and insulated from the first trace connects the other two pillars' vertical wiring traces across the trench in a similar manner. Vias may be used to allow such a second trace to reach down to contact the exposed tops of the vertical wiring traces.

Alternatively, such a cross-connection can be fabricated sublithographically.

PISTON RESHAPING: <Par. 1603> <through Par. 1605>

Wiring in Holes within Pillars:

PILLARS WITH HOLES, CLARIFICATION AND EXPANSION: The pillar side wiring and related sidewall structures shown for the A and B trenches leading to the structure of FIGS. 6, 7 and 8 can also be fabricated inside of trench etch created vertical holes using the same process step sequences. For such a case, a pillar can be masked so as to trench etch holes which extend vertically down from its planar top surface into the interior region of the pillar. It will be noted that the wiring and insulation overlay pattern that runs up and down a face of a pillar, such as that shown for the A or B trenches, was formed by first processing the side walls of a vertical hole, such as the unmasked or exposed hole of the A trench or hole of the B trench. Thus, alternatively, holes trench etched into the interior region of a pillar can be sequentially unmasked and processed following the A or B trench hole shown process step sequences, thereby resulting in a wiring and insulator pattern inside each such vertical hole (in a pillar which contains one or more such holes) which matches the interconnectivity and function performed by the sidewall wiring shown in FIG. 8 for the A or B trenches. When a pillar is fabricated with one such internal corresponding vertical hole for the A trench wiring, and an additional such internal corresponding vertical hole for the B trench wiring, and if such a pillar is layered with dopings to match the FIGS. 7 and 8 pillar layers, then such a pillar is wired inside its interior region equivalently to the side wiring shown for the pillar of FIG. 8. In such a case where the word lines end up formed enclosed by their respective internal (hence non-extending) vertical holes, they can be wired (connected) up to the top surface by adding a splice connection (as described elsewhere herein) which contacts the non-extending word line structure. The upper ends of such word line splice connections can then be connected to conventional planar word lines by conventional masking and via connections. The top of the highest layer 1N the pillar (the upper bit line layer) can be contacted by conventional masking and via connections to conventional bit lines. C trench "U" shaped wiring and insulating stacked layers can be formed following the fabrication sequence described for the C trench processing which led to the C trench structures shown in FIG. 7. However, in this internally wired pillar example, the C trench can be treated as surrounding the pillar on all sides, rather than extending in a single axis. In such a case, where the C trench surrounds all four pillar sides, the lower bit line will be unable to extend outside the region of the bottom of the pillar. An additional hole trench etched in the top surface of the pillar can extend down to reach this bit line layer (2P in this case), and an insulated splice connection (a described elsewhere herein) can contact this bit line layer, and then extend up to the top surface of the pillar where the conductive portion of the splice can be connected to conventional bit lines by conventional masking and via interconnection methods. Conventional planar lithographic techniques can be used to contact the tops of various upward extending conductors. Alternatively, fabrication processing for the word line structures can be deleted from the aforementioned A and B internal pillar vertical holes, and fabricated instead in their own respective additional trench holes which are etched down from the top surface of the pillar. Particularly in the case of the lower word line connection (at layer 3N here), adding an additional vertical hole can remove the word line splice contact upper wiring extension from undesirably overlapping the other structures along the vertical extension of the pillar. However, in the prior example where word line and bit line might have shared the same vertical hole and such overlapping was the case, sufficient standoff insulation deposited and appropriately patterned underlying the splice conductive wiring can prevent electrical interaction between such word line splice wiring and the underlying structures (such as bit lines or FET gates). If upper and lower word line gate control structures are fabricated in the same vertical hole, then a splice connection can link both of these gate control structures together before continuing to extend up to a top surface contact.

A pillar cell structure with internally wired vertical holes can be constructed in a planar layout configuration where its vertical holes are laterally positioned one after the other, in a line. Thus, a pillar can be configured where its planar axis width is just wide enough to accommodate a single vertical hole, while its planar axis length is extended sufficiently to accommodate multiple vertical holes. When such a pillar incorporates four internal vertical holes in a line (planar view), then one such trench etched vertical hole can be used for the aforementioned A trench vertical wiring, one for B trench vertical wiring, one for bit line vertical wiring, and one for word line vertical wiring.

INCREASED GATE FIELD: In the previous pillar transistor discussion regarding "Sources And Drains With Reduced Capacitance," a vertically extending etched out region ("cut") was described. This cut region was fabricated by conventional means such as timed etch, etching the pillar material exposed by a single mask opening which started at the source side of the junction between the source and channel/bulk region, with this mask opening then continuing on (up or down along the axis of the pillar) along the sub-channel bulk region, and on to the drain side of the other junction of the FET pillar transistor. This cut was preferably not so deep as to unsuitably cut too deep into and degrade the channel region. When the underside of a transistor (i.e. what is traditionally thought of as the bottom of a planar transistor, but in this case actually the far side of the pillar from the gate region on a vertical pillar structure) is cut away in this manner, then the bulk region below the region where the channel is formed can be effectively removed, leaving only a thin layer 1N which the channel will form between source and drain regions when said channel is created by appropriate electrical signals. Such a transistor structure thus has a minimally thin channel region combined with the benefit of thicker remaining source and drain regions which hence have substantially lower resistance than they would if they were as thin as the channel region.

Gate insulation layers may be oxidized or deposited so as to suitably cover the exposed remaining bulk region where channels will be formed on each side (i.e. both sides) of the remaining bulk pillar portion, and gate structures can be then fabricated over these insulation layers by means such as described elsewhere herein. When such second etched out region is near enough to the other (first side) channel region (i.e. the remaining intervening channel section of the pillar is sufficiently thin), then under appropriate electrical conditions, electrical activation of such gate structures on either side of said intervening pillar section can draw up channels which will superimpose on one another to varying degrees, depending on such considerations as the gate voltage and/or the channel region thickness, for example. Such opposed and hence supplemental gate structures can increase the gate induced field along the channel. By thinning the intervening channel region to the point where the two channels substantially superimpose, then the resulting "single" channel can be brought up under more desirable electrical conditions such as reduced voltages, for example.

Electrical connection to the bulk region "fourth FET terminal": If gate conductor structures are fabricated from etch-selectable different materials from the bulk material (tungsten, for example), then when the non-gate, non-wired sides of the pillars of such pillar transistors are exposed along the sides of a trench, such as exposed to the C-trench shown in FIG. 4 to the left of the pillar structure, then the gate conductor materials can be etched back from these sides, along with the exposed sides of any associated etch-selectable wiring, where desired, as described elsewhere herein for etch-back of side wiring. Filling these selected etched-out side-facing voids with closed-out insulator, followed by selectively etching back the subsequently exposed such insulator on the sidewalls of such intervening trench as described elsewhere herein, then exposes the gate side rather than the gate area (both sides if such trenches are on both sides) of the aforementioned channel region material (i.e. the bulk remaining between the source and drain portions of the transistor is exposed). Such exposed channel region (bulk) material can then be electrically contacted by structures such as the C-trench U-shaped power distribution traces, suitably connected to appropriate power polarity. Alternatively, splice wiring fabrication techniques described elsewhere herein can extend connections to such channel region bulk material extensions up or down the pillar, and such wiring can be separated by lithographic or aforementioned sub-lithographic patterns trench etched down from masking on top of the wafer. Alternatively, such bulk regions can remain electrically floating (i.e. with "no fourth terminal").

This double-gated type of structure can also be fabricated by alternative means. For example, the pillar containing the transistor can be etched from a top mask that is thin enough in the channel depth axis to make the whole pillar as thin as the previously described channel region (preferably this would be a sub-lithographic mask). By exposing the source and drain regions to gaps in vertical masks of the masking types previously described, thin source and drain regions on such a pillar can be grown larger by selective epitaxial deposition. Alternatively, layer depositions of polysilicon can coat sources and/or drains, such layers effectively thickening such source and/or drain regions, and then these polysilicon layers can be patterned by vertical patterning techniques described elsewhere herein.

Pillars containing one or more transistors can also be fabricated using top masking for the pillar cross-section, where this cross-section is thin (as above) in both planar axes, rather than thin in just one planar axis. Such a thin pillar structure can have gates formed in full-surround rather than just on one or two sides of the pillar. In such a case, source and drain regions would preferably be made larger/thicker by the aforementioned source and drain expanding techniques.

Temporary trench fill support regions as described elsewhere herein may be used on opposite sides of pillars being processed as above to contribute supplemental support to pillar structures being fabricated.

MAGNETIC PILLAR STRUCTURE VARIATIONS: The access transistors shown in FIG. 8 at 20P-19N-18P and 4P-3N-2P, along with associated bit and word lines, can be used in various controlled electronic access applications. One example of this would be to place the structure associated with 4P-3N-2P below a memory element, for example a magnetic memory element, as follows:

The lower layers which become the pillars can be limited to just layers 1N through 4P. Pillar transistors comprising just the 4P-3N-2P pillar layers and the associated horizontally adjacent structures shown in FIGS. 6, 7, 8 can then be constructed in accordance with the disclosed fabrication steps associated with just those structures. An additional top layer of a fill material (such as a conveniently etch-selectable insulator like Parylene, or alternatively silicon dioxide or silicon nitride) can then be deposited to a suitable thickness so as to facilitate the following structures. This insulator is then masked and patterned (with conventional silicon dioxide masking, and ion milling or directional oxygen RIE, for example in this case) so as to create trenches in this insulator which run along the tops of the aforementioned lower pillar structures in one of the two orthogonal trench axes of the pillar pattern. One wall of such a trench (the wall for deposition) is aligned with one side of the pillar. The other opposing trench wall may be offset from the opposing side of the pillar so as to facilitate sufficient deposition angle for the following directional deposition. A coating of a material suitable for the exchange layer of a conventional spin valve sensor (such as FeMn as used in magnetic disk drive heads) is then directionally deposited to a suitable Parylene trench sidewall thickness (110 Angstroms for example) at an angle, by such means as collimated or long throw sputtering via such means as DC magnetron. Then the exposed horizontal surfaces of this coating are vertically directionally etched away by directional etch such as ion milling. This exchange layer is deposited suitably so as to magnetize the adjacent pinned layer (which is to be subsequently deposited) in a direction that is 90 degrees to the subsequent operational current flow in this magnetic spin valve element being created. This trench sidewall angle deposition and vertical etch away process is then repeated for subsequent layers of materials suitable to form a spin valve conductive structure analogous to that of a spin valve disk head. In this example, a subsequent pinned layer of Co (22 Angstroms thickness for example), then an intervening non-magnetic electrically conductive layer such as Cu (25 Angstroms thickness for example; a conventional insulator, preferably thinner, can be used as an option to permit conduction by tunneling instead), followed by a thin layer (10 to 200 Angstroms for example) of ferromagnetic material suitable to disk drive media, such as CoCrTa, CoPtCr, or CoPtNi, or related conventional alloys incorporating Pt, Ta, Ir or Sm, or other suitable materials for similar effect.

The tops (upper exposed edges) of these layered coatings are then vertically directionally coated with an insulator such as silicon dioxide (by such means as collimator or long throw sputtering, or equivalent effect means here and wherever this effect is called out in this document). Each such deposition is typically followed by a clean-up etch-back of extra deposition on the side walls where such extra undesired deposition occurs. A linking directional deposition of the ferromagnetic material is then deposited at an angle so as to coat the top of this insulator top coating, and also link it to the side of the exposed top of the ferromagnetic coating which continues further down, but shadowed by the top of the adjacent wall so as to not deposit too far down the pillar. The upper surface is then masked so as to protect each pillar's upward extension which form a spin valve memory sensor, but so as to divide these (cut them apart) between adjacent pillars, with a gap between each such spin valve element. These spin valve sensor extensions are then etched (cut apart) so as to divide them in this manner. Alternatively, if the aforementioned spin valve sensor structure layers are deposited in reverse order (ferromagnetic first, exchange last), then the trench fill material can be removed, and the ferromagnetic link coating directed toward the sensor layer group side opposite the side just previously described (and shadowed on the far side, or the far side can be filled and patterned) so as to link to a ferromagnetic layer formed on such opposite side.

The trenches are filled with flow-on polymer and planarized so as to leave the tops of the pillars (which are now ferromagnetic material) exposed. The top surface of the pillared substrate is then coated with additional ferromagnetic material with a rectangular hysteresis loop, and patterned so as to extend the pillars further upward with extensions of this material. The sides of these pillars are then coated by deposition of thin insulator such as silicon dioxide. Word-type lines (which write by carrying current in opposite directions on opposite sides of the ferromagnetic layer extension) can then be fabricated in a first axis on both sides of this ferromagnetic upward pillar extension, as with the example which created the word lines associated with pillar layer 19P of FIGS. 6, 7 and 8. This process is then repeated so as to construct orthogonal axis write lines at a higher level. Alternatively, multiple such write lines can be formed at various heights along the upward extension of the ferromagnetic layers by repeating the step sequence for forming the word lines at subsequently increasing heights. Write lines, when suitably activated so as to be carrying current in each axis, in one direction on one side of the pillar, and in the other direction on the other side of the pillar, provide a magnetic field in a direction up or down the pillar of just sufficient strength (when both orthogonal axes are in combination) to reverse the magnetic flux of the aforementioned adjacent ferromagnetic pillar upward extensions, hence writing binary information to the magnetic upward pillar extensions, which then magnetically link to the lower created magnetic spin valve variable resistance elements. (Line conduction in one axis only generates an insufficient magnetic field to reverse the magnetic flux direction of such pillar extensions.)

An electrically conductive, non-magnetic top coating is deposited over the top surfaces contacting the tops of the ferromagnetic pillar upward extensions. An electrical signal applied to this top coating then follows a conduction path down through the ferromagnetic upward extension, then through the spin valve sensing element, and then through the transistor of layers 4P-3N-2P, when the word line associated with 3N is suitably activated. Activation of this word line allows current to flow out onto the bit line associated with 2P. This current varies as a result of prior writing, as a function of the variation in spin valve sensing element resistance.

The preceding structure leaves the previously described vertically layered spin valve resistance region of this pillar structure unencumbered by word lines on its side. If the exchange layer is not deposited before the subsequent layers, then this leaves the ferromagnetic and pinned layers conveniently accessible for further modification as follows: For example, if these two layers are originally made thicker, then they can be subsequently indented at sequential vertical heights on each side of this structural section by etching through successively higher vertical windows. The thickness of these layers is picked so that their thicknesses at the indents are comparable to their earlier preferred thicknesses, but so that the succession of combined vertical indents makes them appear corrugated (in side view). The exchange layer is then angle deposited on the pinned layer side above a masking piston, followed by vertically etching away its horizontal surfaces, and then etching off its upward extension using a vertical window mask. Or the ferromagnetic layer can be patterned, and the pinned layer left unpatterned. This resulting structure can then modify and increase the lengths of the available divergent paths that the electrons can take when they are proceeding ahead with spin antiparallel to the magnetic direction of whichever layer they are currently in when such layers are currently programmed for opposing magnetic directions. When such divergent paths are increased, then the effective resistance of overall path can be increased.

Or, as another option, alternating horizontal thin layers of ferromagnetic material and electrical insulator (thick enough to avoid tunneling) can be sequentially deposited above the top of the 4P layer, for example, before the trenches between the pillars are etched when the pillars are first formed. Then the pillars are etched vertically (by ion milling for example) including these layers above each 4P section. The three spin valve element main sequential vertical layers (ferromagnetic, intervening and pinned) are then directionally deposited as before, but on the side of this layered upward pillar extension. (Interstices between adjacent pillars are filled with FOP and patterned so as to make a wall first; later the spin valve layers are cut apart as in the prior example; or, the lower pillar sections can be patterned first, and then the upper structures cut apart together at the same later time.) This gives the effect of the ferromagnetic layer having horizontal lamellae which are considerably more pronounced than the corrugations of the earlier example. If the trench to the side of the pinned layer is left unmasked (open somewhat to the side of pinned layer wall, but preferably with this trench not wide enough to reach the next adjacent memory element structure) and the pinned layer is appropriately thick, then the sides of the pinned layer may be corrugated and exchange layer coated as in the earlier example if desired.

Alternatively, if the trench to the side of the original style last deposited ferromagnetic layer is left unmasked (open somewhat to the side of ferromagnetic layer wall, but preferably with this trench not wide enough to reach the next adjacent memory element structure) and the ferromagnetic layer is of the original preferred minimal thickness, then the open trench can be exposed to vertical (straight down) directional deposition from bottom to top along the side of the vertical extension of the ferromagnetic layer, where repeated alternations of ferromagnetic layer material is horizontally layered in the trench, followed by an intervening electrical insulator layer material. Each such deposition (by such means as collimator or long throw sputtering, or equivalent effect means here and wherever this effect is called out in this document) is typically followed by a clean-up etch back of extra deposition on the side walls where such extra undesired deposition occurs. This sequence of clean-up depositions creates alternating layers which become horizontal lamellae similar to those in the prior example. Optionally, such vertically deposited lamella layers can be similarly deposited using the pinned material rather than the ferromagnetic material, and thereby create pinned lamellae in a similarly opened (unmasked) trench on the pinned layer side as well. Once the preceding example has been completed for the pinned layer side however, the subsequent coating with the exchange layer must be deposited. This is done most effectively where the underlying horizontal lamella pattern has been selected to permit optimal exposure of the lamellae (or horizontally shorter, vertically elongated protrusions) so as to cause sufficient pinning.

SIDEWALL MASK COATINGS:

The preceeding incorporated by reference text comprises paragraph reference numbers and related excerpts from the original referenced document, where any minor modifications to this text from the original do not change the issues addressed. Drawing figure numbers are changed to conform with the preceeding Brief Description of the Drawings.

The previously described sub-lithographic lamella structures have a wide range of utility. They can transfer patterns at atomic layer thicknesses. Thus they can be used to define quantum wires and quantum well structures, for example.

What is claimed is:

1. A method of fabrication for creating a plurality of adjacent lines,
    (a) each line of each said plurality of adjacent lines extending primarily along the path of a single axis on a plane which lies parallel to the predominant plane of a coincident or contiguous substrate, said predominant plane being considered nominally horizontal and the axis perpendicular to said predominant plane being considered nominally vertical,
    (b) each said plurality of adjacent lines being bounded on at least one side by the adjacent continuous edge of, optionally, material between trenches, additional pluralities of adjacent lines, or another trench or continuous structure,
    (c) where the location of each such adjacent continuous edge was previously the location of a trench reference sidewall, and said trench reference sidewall either was the edge of a previous associated patterning line which was a feature of a pattern defining a two-dimensional image which was transferred from a source not previously connected to the substrate, or said trench reference sidewall was trench etched down from the edge of a previous associated patterning line extending on a plane parallel to said predominant plane,
    (d) where said plurality of adjacent lines are created subsequent to, and at a higher spatial frequency than, patterning lines previously extending on a plane parallel to said predominant plane,
    (e) where, during the fabrication process, each said previous associated patterning line either was a trench, or was bounded on at least one side by a trench opening,
    (f) and where the horizontal location of at least one vertical sidewall of each such adjacent line in said plurality of adjacent lines is determined by a sequence of depositions forming an interlamination of layers which each have a deposited thickness which is substantially uniform where the lamination is laying horizontally, or substantially uniform where it is laying vertically, each such layer being of consistent vertical height where laying vertically, said layers being formed so as to be only conformal to the surface topography,
    (g) said layers being built up from and extending horizontally parallel to a single sidewall, said layers having continuous regions along this horizontal parallel extension which are vertically straight and vertically parallel to said single sidewall, each such layer covering all of any vertical face of its preceding layer or said single sidewall, the location of the face of said single sidewall coinciding with the face location of said trench reference sidewall,
    (h) such that electronic component features become created which incorporate or are derived from said plurality of adjacent lines, where said electronic component features contribute to the construction of a microelectronic component array,
    (i) where said associated patterning lines may be lamellar, having at least sufficient upward extension to permit the foregoing processes, and
    (j) where said electronic component features and such pluralities of adjacent lines can be fabricated sub-lithographically when said associated patterning lines are lithographic.

2. A method of fabrication for creating a plurality of adjacent lines as in claim 1, where said adjacent lines are part of an integrated circuit structure where vertical windows in a coating are etched at a plurality of heights on the side of a trench, said coating extending above and below each window, the height of each such window being independently determined by a separate successive height determining operation, wherein each such height is determined by the associated height of another separate supplemental structure which is created independently from features originally existing on the trench sidewall, said windows acting as mask openings for etching the sides of said trench in multiple locations which are stacked vertically above and below one another on the same trench sidewall, said openings serving as regions of electrical contact for deposited vertical insulated wiring between the contact terminals of various semiconductive components.

3. A method of fabrication as in claim 1, where said electronic component features are suitable for use in a semiconductor memory.

4. A method of fabrication as in claim 1, where said electronic component features are suitable for use in a static random access memory.

5. A method of fabrication as in claim 1, where said electronic component features are suitable for use in a flash memory.

6. A method of fabrication as in claim 1, where said electronic component features are suitable for use in a non-volatile memory which is not a flash memory.

7. A method of fabrication as in claim 1, where said electronic component features are suitable for use in semiconductor logic component arrays.

8. A method of fabrication as in claim 1, where said electronic component features are suitable for use in semiconductor products which are not silicon based.

9. A method of fabrication as in claim 1, where said electronic component features are suitable for use in magnetic disk products.

10. A method of fabrication as in claim 1, where said electronic component features are suitable to form part or all of a structure which can be electrically isolated from other structures in its vertical extension, by removing and re-depositing material so as to sever its vertical extension.

11. A method of fabrication as in claim 1, where said electronic component features are suitable for use in structures which serve an equivalent function to an electrical cross-over-connection, where the pattern of such cross-connection does not have the pattern of a reference pattern from which it was derived.

12. A method of fabrication as in claim 1, where said electronic component features are suitable for use in a periphery interface for an electronic cell array.

13. A method of fabrication as in claim 1, where said electronic component features are semiconductor material which has been shortened along a planar axis.

14. A method of fabrication as in claim 1, where said electronic component features are parts of structures which are suitable for vertical patterning by use of liquid pistons, where said liquid pistons have the sub-0.1 micron trench filling properties typical of SU-8 photomasking material when it is greatly thinned with gamma butyrolactone, also known as "GBL," or with N methyl pyrollodine, also known as "NMP," as well as having the low volatility of such a greatly thinned material such that it is practical to use without boiling at less than 1 Torr pressure in vacuum processing deposition and etching chambers.

15. A method of fabrication as in claim 1, where said electronic component features are conductive wiring traces which can be as thin as the structure of a cohesive atomic layer deposition.

16. A method of fabrication as in claim 1, where said electronic component features are suitable for use in vertically wired holes in pillar structures which are or are parts of electronic components.

17. A method of fabrication where a first plurality of adjacent lines is created as in claim 1, followed by creation of a second such plurality of adjacent lines, where these second adjacent lines cross the original locations of said first lines when viewed from above the nominally horizontal planes in which each plurality of adjacent lines extends, and where crossing trench locations between said first and second pluralities of adjacent lines are used to define locations of additional structures which are subsequently created on an adjacent plane.

18. A method of fabrication as in claim 17, where said additional structures are suitable for use in a semiconductor memory.

19. A method of fabrication as in claim 17, where said additional structures are suitable for use in a static random access memory.

20. A method of fabrication as in claim 17, where said additional structures are suitable for use in a flash memory.

21. A method of fabrication as in claim 17, where said additional structures are suitable for use in a non-volatile memory which is not a flash memory.

22. A method of fabrication as in claim 17, where said additional structures are suitable for use in semiconductor logic component arrays.

23. A method of fabrication as in claim 17, where said additional structures are suitable for use in semiconductor products which are not silicon based.

24. A method of fabrication as in claim 17, where said additional structures are suitable for use in magnetic disk products.

25. A method of fabrication as in claim 17, where each said additional structure is suitable to form part or all of a structure which can be electrically isolated from other structures in its vertical extension, by removing and re-depositing material so as to sever its vertical extension.

26. A method of fabrication as in claim 17, where each said additional structure is suitable for use in conjunction with structures which serve an equivalent function to an electrical cross-over-connection, where the pattern of such cross-connection does not have the pattern of a reference pattern from which it was derived.

27. A method of fabrication as in claim 17, where said additional structures are suitable for use in conjunction with a periphery interface for an electronic cell array.

28. A method of fabrication as in claim 17, where said additional structures are semiconductor material which has been shortened along a planar axis.

29. A method of fabrication as in claim 17, where said additional structures are parts of structures which are suitable for vertical patterning by use of liquid pistons, where said liquid pistons have the sub-0.1 micron trench filling properties typical of SU-8 photomasking material when it is greatly thinned with gamma butyrolactone, also known as "GBL," or with N methyl pyrollodine, also known as "NMP," as well as having the low volatility of such a greatly thinned material such that it is practical to use without boiling at less than 1 Torr pressure in vacuum processing deposition and etching chambers.

30. A method of fabrication as in claim 17, where said electronic component features are suitable for use in conjunction with vertically wired holes in pillar structures which are or are parts of electronic components.

31. A structure comprising a plurality of adjacent lines, where
(a) each line of each said plurality of adjacent lines extends primarily along the path of a single axis on a plane which lies parallel to the predominant plane of a coincident or contiguous substrate, said predominant plane being considered nominally horizontal and the axis perpendicular to said predominant plane being considered nominally vertical,
(b) each said plurality of adjacent lines being bounded on at least one side by the adjacent continuous edge of, optionally, material between trenches, additional pluralities of adjacent lines, or another trench or continuous structure,
(c) the location of each such adjacent continuous edge being coincident with the location of a trench reference sidewall, said trench reference sidewall either being the edge of an associated patterning line which is part of a two-dimensional transfer image from a source not connected to the substrate, or the location of the edge of said trench reference sidewall being spatially aligned with the location of the edge of an associated patterning line with extension on a plane parallel to said predominant plane,
(d) where said plurality of adjacent lines have a higher spatial frequency than such associated patterning lines with extension on a plane parallel to said predominant plane,
(e) each said associated patterning line either bounded on at least one side by a trench opening, or having the form of a trench,
(f) and where the horizontal location of at least one vertical sidewall of each such adjacent line in said plurality of adjacent lines is dependent on the thickness of the interlamination of multiple layered depositions, each layer having a deposited thickness which is substantially uniform where the lamination is laying horizontally, or substantially uniform where it is laying vertically, each such layer being of consistent vertical height where laying vertically, said layers being only conformal to the surface topography,
(g) said layers being a laminate extending horizontally parallel to a single sidewall, said layers having continuous regions along this horizontal parallel extension which are vertically straight and vertically parallel to said single sidewall, each such layer covering all of any vertical face of said single sidewall, or all of its next adjacent layer which is closer to said single sidewall, the location of the face of said single sidewall coinciding with the face location of said trench reference sidewall,
(h) such that features may incorporate or be derived from such plurality of adjacent lines, where said electronic component features contribute to the construction of a microelectronic component array,
(i) where said associated patterning lines may be lamellar, having at least sufficient upward extension to permit the foregoing processes, and
(j) where said electronic component features and such pluralities of adjacent lines can be fabricated sub-lithographically when said associated patterning lines are lithographic.

32. A structure comprising a plurality of adjacent lines as in claim 31, where said structure is part of a complex three-dimensional integrated circuit structure comprising groups of components which include multiple transistors of the same crystal orientation arranged in a first axis, said crystal orientation either being created by continuous epitaxial growth from a crystal substrate by means of blanket epitaxy, or being the crystal orientation of the substrate itself, this first axis extending into a first dimension, where these components are interconnected by conductive circuitry extending in a plurality of axes, said axes extending into three different dimensions, and where wiring extending along the vertical axis has a plurality of links between vertically distributed contacts to vertically distributed independently doped epitaxially grown regions.

33. A structure comprising a plurality of adjacent lines as in claim 31, where said structure is part of an integrated circuit structure incorporating wiring in both horizontal and vertical directions, said wiring having been fabricated without use of photolithographic masks which have the pattern of this wiring.

34. A structure comprising a plurality of adjacent lines as in claim 31, where said structure comprises a first plurality of adjacent lines, and also a second such plurality of adjacent lines, where these second adjacent lines cross the original locations of said first lines when viewed from above the nominally horizontal planes in which each plurality of adjacent lines extends, and where crossing trench locations between said first and second pluralities of adjacent lines are used to define locations of additional structures which are subsequently created on an adjacent plane.

35. A structure comprising a plurality of adjacent lines as in claim 34, where said structure is part of a complex three-dimensional integrated circuit structure comprising groups of components which include multiple transistors of the same crystal orientation arranged in a first axis, said crystal orientation either being created by continuous epitaxial growth from a crystal substrate by means of blanket epitaxy, or being the crystal orientation of the substrate itself, this first axis extending into a first dimension, where these components are interconnected by conductive circuitry extending in a plurality of axes, said axes extending into three different dimensions, and where wiring extending along the vertical axis has a plurality of links between vertically distributed contacts to vertically distributed independently doped epitaxially grown regions.

36. A structure comprising a plurality of adjacent lines as in claim 34, where said structure is part of an integrated circuit structure incorporating wiring in both horizontal and vertical directions, said wiring having been fabricated without use of photolithographic masks which have the pattern of this wiring.

* * * * *